(12) United States Patent
Yoo et al.

(10) Patent No.: US 10,504,901 B2
(45) Date of Patent: Dec. 10, 2019

(54) SUBSTRATE PROCESSING METHOD AND DEVICE MANUFACTURED USING THE SAME

(71) Applicant: ASM IP Holding B.V., Almere (NL)

(72) Inventors: Tae Hee Yoo, Bucheon-si (KR); Yoon Ki Min, Seoul (KR); Yong Min Yoo, Seoul (KR)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 15/951,644

(22) Filed: Apr. 12, 2018

(65) Prior Publication Data

US 2018/0315758 A1 Nov. 1, 2018

Related U.S. Application Data

(60) Provisional application No. 62/490,469, filed on Apr. 26, 2017.

(51) Int. Cl.
| | |
|---|---|
| *G11C 16/06* | (2006.01) |
| *H01L 27/105* | (2006.01) |
| *H01L 21/48* | (2006.01) |
| *H01L 21/762* | (2006.01) |
| *H01L 21/768* | (2006.01) |
| *G11C 8/14* | (2006.01) |

(52) U.S. Cl.
CPC ........ *H01L 27/1052* (2013.01); *H01L 21/486* (2013.01); *H01L 21/76202* (2013.01); *H01L 21/76895* (2013.01); *G11C 8/14* (2013.01)

(58) Field of Classification Search
CPC ...................................................... G11C 8/14

USPC .................................................... 365/185.12
See application file for complete search history.

(56) References Cited

U.S. PATENT DOCUMENTS

| | | | |
|---|---|---|---|
| 3,708,728 A | 1/1973 | Sterling et al. |
| 3,925,337 A | 12/1975 | Heiberger |
| 4,058,430 A | 11/1977 | Suntola et al. |
| 4,282,267 A | 8/1981 | Küyel |
| 4,389,973 A | 6/1983 | Suntola et al. |
| 4,565,747 A | 1/1986 | Nakae et al. |

(Continued)

FOREIGN PATENT DOCUMENTS

| | | |
|---|---|---|
| EP | 0387403 | 9/1990 |
| EP | 0394054 | 10/1990 |

(Continued)

OTHER PUBLICATIONS

File History of U.S. Appl. No. 14/939,984, filed Nov. 12, 2015.

(Continued)

*Primary Examiner* — Hoai V Ho
(74) *Attorney, Agent, or Firm* — Knobbe Martens Olson & Bear LLP

(57) ABSTRACT

A substrate processing method includes stacking a plurality of stack structures each including an insulating layer and a sacrificial layer, on one another. The method also includes generating a stair structure by etching the stack structures and generating a separation layer on a side surface of the stair structure. The method further includes removing the sacrificial layer and generating conductive word line structures in spaces from which the sacrificial layer is removed. The separation layer is provided between the conductive word line structures.

15 Claims, 19 Drawing Sheets

(56) References Cited

U.S. PATENT DOCUMENTS

| | | |
|---|---|---|
| 4,747,367 A | 5/1988 | Posa |
| 4,761,269 A | 8/1988 | Conger et al. |
| 4,767,494 A | 8/1988 | Kobayashi |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,482,262 A | 1/1996 | Hayakawa et al. |
| 5,595,784 A | 1/1997 | Kaim et al. |
| 5,603,771 A | 2/1997 | Seiberras et al. |
| 5,618,395 A | 4/1997 | Gartner |
| 5,691,235 A | 11/1997 | Meikle et al. |
| 5,693,139 A | 12/1997 | Nishizawa et al. |
| 5,711,811 A | 1/1998 | Suntola et al. |
| 5,723,384 A | 3/1998 | Park et al. |
| 5,744,254 A | 4/1998 | Kampe et al. |
| 5,769,950 A | 6/1998 | Takasu et al. |
| 5,789,024 A | 8/1998 | Levy et al. |
| 5,855,680 A | 1/1999 | Soininen |
| 5,916,365 A | 6/1999 | Sherman |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo, Jr. et al. |
| 5,973,400 A | 10/1999 | Murakami et al. |
| 6,006,763 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,159,871 A | 12/2000 | Loboda et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,410,462 B1 | 6/2002 | Yang et al. |
| 6,416,577 B1 | 7/2002 | Suntola et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,583,048 B1 | 6/2003 | Vincent et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,632,595 B2 | 10/2003 | Kikuchi et al. |
| 6,652,924 B2 | 11/2003 | Sherman |
| 6,706,115 B2 | 3/2004 | Leskelä et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin et al. |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,863,727 B1 | 3/2005 | Elers et al. |
| 6,902,763 B1 | 6/2005 | Elers et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,074,690 B1 | 7/2006 | Gauri et al. |
| 7,138,336 B2 | 11/2006 | Lee et al. |
| 7,211,144 B2 | 5/2007 | Lu et al. |
| 7,211,508 B2 | 5/2007 | Chung et al. |
| 7,268,078 B2 | 9/2007 | Iyer |
| 7,329,590 B2 | 2/2008 | Elers et al. |
| 7,405,158 B2 | 7/2008 | Lai et al. |
| 7,410,666 B2 | 8/2008 | Elers et al. |
| 7,416,981 B2 | 8/2008 | Lee et al. |
| 7,611,751 B2 | 11/2009 | Elers |
| 7,749,871 B2 | 7/2010 | Elers et al. |
| 7,776,396 B2 | 8/2010 | Kobrin et al. |
| 7,794,798 B2 | 9/2010 | Hautala |
| 8,217,446 B2 | 7/2012 | Fukuzumi et al. |
| 9,111,746 B2 | 8/2015 | Ranjan et al. |
| 9,171,736 B2 | 10/2015 | Raley et al. |
| 9,425,038 B2 | 8/2016 | Shimizu |
| 9,455,138 B1 | 9/2016 | Fukazawa et al. |
| 9,784,695 B2 | 10/2017 | Blendl |
| 9,786,491 B2 | 10/2017 | Suzuki et al. |
| 9,786,492 B2 | 10/2017 | Suzuki et al. |
| 2001/0004479 A1 | 6/2001 | Cheung et al. |
| 2001/0005546 A1 | 6/2001 | Cheung et al. |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0182320 A1 | 12/2002 | Leskela et al. |
| 2003/0015764 A1 | 1/2003 | Raaijmakers et al. |
| 2003/0026989 A1 | 2/2003 | George et al. |
| 2003/0031793 A1 | 2/2003 | Chang et al. |
| 2003/0049931 A1 | 3/2003 | Byun et al. |
| 2003/0072975 A1 | 4/2003 | Shero et al. |
| 2003/0082296 A1 | 5/2003 | Elers et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2004/0130029 A1 | 7/2004 | Raaijmakers et al. |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2004/0240820 A1 | 12/2004 | Johnson et al. |
| 2005/0037557 A1 | 2/2005 | Doczy et al. |
| 2005/0106877 A1 | 5/2005 | Elers et al. |
| 2005/0215008 A1 | 9/2005 | Orlowski et al. |
| 2005/0236694 A1 | 10/2005 | Wu et al. |
| 2005/0271813 A1 | 12/2005 | Kher et al. |
| 2006/0019494 A1 | 1/2006 | Cao et al. |
| 2006/0078679 A1 | 4/2006 | Elers et al. |
| 2006/0079090 A1 | 4/2006 | Elers et al. |
| 2006/0079099 A1 | 4/2006 | Nguyen et al. |
| 2006/0165892 A1 | 7/2006 | Weidman |
| 2006/0211224 A1 | 9/2006 | Matsuda et al. |

(56) References Cited

U.S. PATENT DOCUMENTS

| | | |
|---|---|---|
| 2006/0223300 A1 | 10/2006 | Simka et al. |
| 2006/0240187 A1 | 10/2006 | Weidman |
| 2007/0054046 A1 | 3/2007 | Ishizaka et al. |
| 2007/0148350 A1 | 6/2007 | Rahtu et al. |
| 2007/0218670 A1 | 9/2007 | Ishizaka |
| 2007/0251444 A1 | 11/2007 | Gros-Jean et al. |
| 2008/0102204 A1 | 5/2008 | Elers |
| 2008/0102613 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |
| 2009/0081868 A1 | 3/2009 | Shah et al. |
| 2009/0104791 A1 | 4/2009 | Nemani |
| 2009/0211526 A1 | 8/2009 | Tanaka et al. |
| 2009/0315093 A1 | 12/2009 | Li et al. |
| 2010/0092781 A1 | 4/2010 | Zambov et al. |
| 2010/0239742 A1 | 9/2010 | Larson-Smith et al. |
| 2010/0297545 A1 | 11/2010 | Yoo et al. |
| 2011/0262642 A1 | 10/2011 | Xiao et al. |
| 2011/0278533 A1 | 11/2011 | Hillhouse et al. |
| 2012/0003831 A1 | 1/2012 | Kang et al. |
| 2012/0070944 A1* | 3/2012 | Kim .................... H01L 27/0688 438/128 |
| 2012/0119283 A1 | 5/2012 | Lee et al. |
| 2012/0208347 A1 | 8/2012 | Hwang et al. |
| 2012/0269962 A1 | 10/2012 | Blomberg et al. |
| 2013/0078454 A1 | 3/2013 | Thompson et al. |
| 2013/0134372 A1 | 5/2013 | Sakuma et al. |
| 2013/0196082 A1 | 8/2013 | Spence |
| 2013/0330935 A1 | 12/2013 | Varadarajan |
| 2014/0272194 A1 | 9/2014 | Xiao et al. |
| 2014/0295109 A1 | 10/2014 | Sakakura |
| 2014/0349107 A1 | 11/2014 | Thoumazet et al. |
| 2014/0367764 A1 | 12/2014 | Lee et al. |
| 2015/0087156 A1 | 3/2015 | Kamimura et al. |
| 2015/0118865 A1 | 4/2015 | Shimizu |
| 2015/0214103 A1 | 7/2015 | Matsuda |
| 2015/0303056 A1 | 10/2015 | Varadarajan et al. |
| 2015/0303101 A1 | 10/2015 | Blomberg et al. |
| 2015/0376211 A1 | 12/2015 | Girard et al. |
| 2016/0064281 A1 | 3/2016 | Izumi et al. |
| 2016/0093485 A1 | 3/2016 | Kobayashi et al. |
| 2017/0140924 A1 | 5/2017 | Suzuki et al. |
| 2017/0213726 A1 | 7/2017 | Saly et al. |
| 2017/0309476 A1 | 10/2017 | Venkatasubramanian et al. |
| 2017/0323782 A1 | 11/2017 | Suzuki et al. |
| 2017/0352680 A1* | 12/2017 | Shin ....................... H01L 23/535 |
| 2017/0365462 A1 | 12/2017 | Varadarajan |
| 2018/0005814 A1 | 1/2018 | Kumar et al. |
| 2018/0013078 A1 | 1/2018 | Lee et al. |
| 2018/0151355 A1 | 5/2018 | Fukazawa |

FOREIGN PATENT DOCUMENTS

| | | |
|---|---|---|
| EP | 0442490 | 8/1991 |
| EP | 0526779 | 2/1993 |
| EP | 0528779 | 2/1993 |
| EP | 0573033 | 12/1993 |
| EP | 0774533 | 5/1997 |
| EP | 0899779 | 3/1999 |
| EP | 1158070 | 11/2001 |
| EP | 1167567 | 1/2002 |
| EP | 2620440 | 7/2013 |
| EP | 3196336 | 7/2017 |
| JP | 58-033841 | 2/1983 |
| JP | H06-037041 | 2/1994 |
| JP | H06-069157 | 3/1994 |
| JP | H07-230957 | 8/1995 |
| JP | H08-264530 | 10/1996 |
| JP | 09-087857 | 3/1997 |
| JP | 2004-288979 | 10/2004 |
| JP | 2006-040936 | 2/2006 |
| KR | 2003-0016346 | 2/2003 |
| KR | 2003-0057938 | 7/2003 |
| KR | 2003-0093575 | 12/2003 |
| KR | 2004-0060402 | 7/2004 |
| KR | 2004-0079173 | 9/2004 |
| KR | 2004-0079175 | 9/2004 |
| KR | 2004-0100767 | 12/2004 |
| KR | 2005-0000168 | 1/2005 |
| KR | 2018-0005128 | 1/2018 |
| TW | 201021202 A | 1/2010 |
| TW | 201403759 A | 1/2014 |
| WO | WO 96/17107 | 6/1996 |
| WO | WO 96/18766 | 6/1996 |
| WO | WO 98/51838 | 11/1998 |
| WO | WO 99/37655 | 7/1999 |
| WO | WO 00/01006 | 1/2000 |
| WO | WO 00/04704 | 1/2000 |
| WO | WO 00/40772 | 7/2000 |
| WO | WO 00/47404 | 8/2000 |
| WO | WO 00/47796 | 8/2000 |
| WO | WO 00/54320 | 9/2000 |
| WO | WO 00/55895 | 9/2000 |
| WO | WO 00/63957 | 10/2000 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/53565 | 7/2001 |
| WO | WO 01/66832 | 9/2001 |
| WO | WO 01/78213 | 10/2001 |
| WO | WO 01/88972 | 11/2001 |
| WO | WO 2004/077515 | 9/2004 |
| WO | WO 2006/080782 | 8/2006 |
| WO | WO 2006/097525 | 9/2006 |
| WO | WO 2007/041089 | 4/2007 |
| WO | WO 2008/051851 | 5/2008 |
| WO | WO 2008/121478 | 10/2008 |
| WO | WO 2008/137399 | 11/2008 |
| WO | WO 2018/204709 | 11/2018 |

OTHER PUBLICATIONS

File History of U.S. Appl. No. 15/707,749, filed Sep. 18, 2017.
File History of U.S. Appl. No. 15/707,878, filed Sep. 18, 2017.
File History of U.S. Appl. No. 15/588,026, filed May 5, 2017.
File History of U.S. Appl. No. 15/787,342, filed Oct. 18, 2017.
File History of U.S. Appl. No. 15/951,626, filed Apr. 12, 2018.
Closser et al., "Molecular Layer Deposition of a Highly Stable Oxycarbide Thin Film Using an Organic Chlorosilane and Water", ACS Appl. Mater. Interfaces 2018, 10, pp. 24266-24274.
Gallis et al., "White light emission from amorphous silicon oxycarbide (a-SiCxOy) thin films: Role of composition and postdeposition annealing", Applied Physics Letters 97, 2010, pp. 0810905-1-08109053.
Lee et al., "Characteristics of low-k SiOC films deposited via atomic layer deposition", Thin Solid Films 645 (2018), pp. 334-339.
Wrobel et al., "Silicon Oxycarbide Films Produced by Remote Microwave Hydrogen Plasma CVD using a Tetramethyldisiloxane Precursor: Growth Kinetics, Structure, Surface Morphology, and Properties", Chem. Vap. Deposition 2015, 21, pp. 307-318.
1988RD-0296076 (Nov. 20, 1998), Field effect transistor structure with improved transconductant—contg. spacer-less conducting gate oxide, and tungsten deposited on source and drain, EAST Version 2.0.1.4 Patent-Assignee: Anonymous[ANON], Sep. 19, 2005.
Aarik et al., "Influence of substrate temperature on atomic layer growth and properties of HfO2 thin films," Thin Solid Films, vol. 340, 1999, pp. 110-116.
Alen et al., "Atomic Layer Deposition of Ta(Al)N(C) Thin Films Using Trimethylaluminum as a Reducing Agent," Journal of the Electrochemical Society, vol. 148, No. 10, pp. G566-G571, 2001.
Andricacos et al., "Damascene copper electroplating for chip," IBM Jour. Research and Dev., 1998, vol. 42, Issue 5, pp. 567-574.
Bain et al., "Deposition of tungsten by plasma enhanced chemical vapour deposition," J. Phys. IV France, 1999, vol. 9, pp. 827-833.
Chang et al, "Chemical Vapor Deposition of Tantalum Carbide and Carbonitride Thin Films from Me3CE=Ta(CH2CMe3)3 (E=CH, N)," J. Mater. Chem. 13:365-369 (2003).

(56) References Cited

OTHER PUBLICATIONS

Chookarjorn et al, "Design of Stable Nanocrystalline Alloys," Science Magazine, vol. 337, pp. 951-954, Aug. 24, 2012.
Elers et al., "NbCl5 as a precursor in atomic layer epitaxy," Applied Surface Science, Jul. 9, 1994, vol. 82/83, pp. 468-474.
Favis et al., "Atomic layer epitaxy of silicon, silicon/germanium and silicon carbide via extraction/exchange processes," Avail. NTIS. Report, 1991, pp. 33.
Fuyuki et al., "Atomic layer epitaxy controlled by surface superstructures in silicon carbide," Thin Solid Films, 1993, vol. 225, Issue 1-2, pp. 225-229.
Fuyuki et al., "Atomic layer epitaxy of cubic silicon carbide by gas source MBE using surface superstructure," J. Cryst. Growth, 1989, vol. 95, Issue 1-4, pp. 461-463.
Girolami et al., "Tailored Organometallics as Low-Temperature CVD Precursors to Thin Films," Materials Research Society Symposium Proceedings, 1988, vol. 121, pp. 429-438.
Gordon et al., "A Kinetic Model for Step Coverage by Atomic Layer Deposition in Narrow Holes or Trenches," Chemical Vapor Deposition, 2003, vol. 9, No. 2, pp. 73-78.
Hara et al., "Atomic layer control of .beta.-silicon carbide (001) surface," Springer Proc. Phys., 1992, pp. 90-95.
Hiltunen et al., "Nitrides of titanium, niobium, tantalum and molybdenum grown as thin films by the atomic layer epitaxy method," Thin Solid Films, 1988, vol. 166, pp. 149-154.
Hultman et al., "Review of the Thermal and Mechanical Stability of TiN-based Thin Films," Zeitscrift Fur Metallkunde 90 (10): 803-813 (1999).
Ihanus et al., "ALE growth of ZnS1—xSex thin films by substituting surface sulfur with elemental selenium," Appl. Surface Sci., 112:154-158 (1997).
International Search Report and Written Opinion dated Apr. 7, 2008, Application No. PCT/US2007/082131.
International Search Report and Written Opinion dated Jun. 25, 2015 in Application No. PCT/US2015/023492.
Jehn et al., Gmelin Handbook of Inorganic and Organometallic Chemistry, 8th Edition, 1993, vol. A 5b, Issue 54, pp. 131-154.
Jeon et al., "A Study on the Characteristics of TiN Thin Film Deposited by Atomic Layer Chemical Vapor Deposition Method," J. Vac .Sci. Technol. A, 2000, vol. 18, Issue 4, pp. 1595-1598.
Juppo et al., "Deposition of copper films by an alternate supply of CuCl and Zn," J. Vac. Sci. Technol A, Jul./Aug. 1997, vol. 15, Issue 4, pp. 2330-2333.
Kattelus et al., "Electrical Properties of Tantalum Based Composite Oxide Films," Mat. Res. Soc. Symp. Proc. vol. 284, pp. 511-516 (1993).
Kattelus et al., "Layered tantalum-aluminum oxide films deposited by atomic layer epitaxy," Thin Solid Films, Vo. 225, pp. 296-298 (1993).
Kim et al., "Atomic-layer-deposited WNxCy thin films as diffusion barrier for copper metallization," Applied Physics Letters, Jun. 23, 2003, vol. 82, Issue 25, pp. 4486-4488.
Kim et al., "Novel capacitor technology for high density stand-alone and embedded DRAMs," IEEE International Electron Devices Meeting, IEDM (2000).
Kim et al., "Pre-treatments applied to oxidized aluminum surfaces to modify the interfacial bonding with bis-1, 2-(triethoxysilyl) ethane (BTSE)—Part I. High-purity Al with native oxide," Applied Surface Science 252(5), 2005, pp. 1293-1304.
Kim et al., "Pre-treatments applied to oxidized aluminum surfaces to modify the interfacial bonding with bis-1,2-(triethoxysily1) ethane (BTSE)—Part II. Anodized 7075-T6 Al alloy," Applied Surface Science 252(5), 2005, pp. 1305-1312.
Kirk-Othmer, Encyclopedia of Chemical Technology, John Wiley & Sons, Inc., 1992, vol. 4, pp. 841-878.
Klaus et al., "Atomic layer deposition of tungsten and tungsten nitride using sequential surface reactions," AVS 46th International Symposium, 1999, Seattle, WA, US.
Klaus et al., "Atomic Layer Deposition of Tungsten Nitride Films Using Sequential Surface Reactions," Journal of the Electrochemical Society, 2000, vol. 147, Issue 3, pp. 1175-1181.
Klaus et al., "Atomic layer deposition of tungsten using sequential surface chemistry with a sacrificial stripping reaction," Thin Solid Films, 2000, vol. 360, pp. 145-153.
Klaus et al., "Atomically controlled growth of tungsten and tungsten nitride using sequential surface reactions," Applied Surface Science, 2000, vol. 162-163, pp. 479-491.
Kukli et al., "Properties of (Nb1—xTax)2O5 Solid Solutions and (Nb1—xTax)2O5—ZrO2 Nanolaminates Growth by Atomic Layer Epitaxy," NanoStructured Materials, 1997, vol. 8, pp. 785-793.
Lai et al., "Precursors for Organometallic Chemical Vapor Deposition of Tungsten Carbide Films," Chem. Mater., 1995, vol. 7, pp. 2284-2292.
Lakomaa et al., "Surface reactions in Al2O3 growth from trimethylaluminum and water by atomic layer epitaxy," Applied Surface Science, vol. 107, pp. 107-115 (1996).
Leskelä et al., "ALD precursor chemistry: Evolution and future challenges," Jour. Phys. IV France 9, 1999, pp. 837-852.
Ludviksson et al., "Low-Temperature Thermal CVD of Ti-Al Metal Films Using a Strong Reducing Agent," Chem. Vap. Deposition, 1998, vol. 4, Issue 4, pp. 129-132.
Martensson et al., "Atomic Layer Epitaxy of Copper and Tantalum," Chemical Vapor Deposition," 1997, vol. 3, Issue 1, pp. 45-50.
Martensson et al., "Cu(ThD)2 as Copper Source in Atomic Layer Epitaxy," Electrochemical Society Proceedings, vol. 97-25, (1997) pp. 1529-1536.
Martensson, "Use of atomic layer epitaxy for fabrication of Si/TiN/Cu structures," J. Vac. Sci. Technol. B, Sep./Oct. 1999, vol. 17, Issue 5, pp. 2122-2128.
Matsunami et al., "Hetero-interface control and atomic layer epitaxy of SiC," Applied Surface Science, 1997, vol. 112, pp. 171-175.
Min et al., "Atomic Layer Deposition of TiN Films by Alternate Supply of Tetrakis (ethylmethylamino)—Titanium and Ammonia," Jpn. J. Appl. Phys., 1998, vol. 37, pp. 4999-5004.
Min et al., "Atomic Layer Deposition of TiN Thin Films by Sequential Introduction of Ti Precursor and HN3," Mat. Res. Soc. Symp. Proc., 1998, vol. 514, pp. 337-342.
Nakajima et al., "Chemical Vapor Deposition of Tungsten Carbide, Molybdenum Carbide Nitride, and Molybdenum Nitride Films," J. Electrochem. Soc., Jun. 1997, vol. 144, Issue 6, pp. 2096-2100.
Polyakov et al., "Growth of GaBN Ternary Solutions by Organometallic Vapor Phase Epitaxy," Journal of Electronic Materials, 1997, vol. 26, Issue 3, pp. 237-242.
Ritala et al., "Controlled Growth of TaN, Ta3N5, and TaOxNy Thin Films by Atomic Layer Deposition," Chem. Mater., 1999, vol. 11, pp. 1712-1718.
Ritala et al., "Atomic Layer Epitaxy Growth of TiN Thin Films from TiI4 and NH3," J. Electrochem. Soc., Aug. 1998, vol. 145, Issue 8, pp. 2914-2920.
Ritala et al., "Atomic layer epitaxy growth of TiN thin films," J. Electrochem. Soc., 1995, vol. 142, Issue 8, pp. 2731-2737.
Ritala et al., "Effects of intermediate zinc pulses on properties of TiN and NbN films deposited by atomic layer epitaxy," Appl. Surf. Sci., 1997, vol. 120, pp. 199-212.
Ritala et al., "Perfectly conformal TiN and Al2O3 films deposited by atomic layer deposition," Chem. Vapor Deposition, 1999, vol. 5, pp. 7-9.
Ritala et al., "Surface roughness reduction in atomic layer epitaxy grown of titanium dioxide thin films," Thin Solid Films, vol. 249, pp. 155-162 (1994).
Sadayuki et al., "Sub-atomic layer growth of SiC at low temperatures," Japanese Journal of Applied Physics, 1995, vol. 34, Issue 11, pp. 6166-6170.
Sherman et al., "Plasma enhanced atomic layer deposition of Ta for diffusion barrier applications," AVS 46th International Symposium, Oct. 26, 1999, Seattle, WA, US.
Song et al., "Formation of Tantalum Carbide and Nitride Phases in Atomic Layer Deposition Using Hydrogen Plasm and tert-Butylimido-tris(diethylamido)-tantalum (TBTDET), and its Effect on Material Properties," Chemical Vapor Deposition, 2008, vol. 14, pp. 334-338.

(56) References Cited

OTHER PUBLICATIONS

Suntola, "Atomic Layer Epitaxy," Handbook of Crystal Growth 3, Ch. 14, pp. 601-663 (1994).

Tulhoff et al., Ullmann's Encyclopedia of Industrial Chemistry, 5th, Completely Revised Edition, 1986, vol. A5, pp. 61-77.

U.S. Appl. No. 10/049,125, filed Aug. 20, 2002 including prosecution history, including but not limited to, Office Action dated Apr. 8, 2004, Office Action dated Jun. 18, 2003, and Office Action dated Oct. 27, 2003.

U.S. Appl. No. 10/242,368, filed Sep. 12, 2002 including prosecution history, including but not limited to, Office Action dated Oct. 20, 2014, Office Action dated Apr. 27, 2004, and Notice of Allowance dated Jul. 19, 2005.

U.S. Appl. No. 10/969,297, filed Oct. 19, 2004 including prosecution history, including but not limited to, Office Action dated Oct. 11, 2006, Office Action dated Apr. 12, 2007, and Notice of Allowance dated Sep. 18, 2007.

U.S. Appl. No. 11/286,203, filed Nov. 22, 2005 including prosecution history, including but not limited to Office Action dated Sep. 28, 2007.

U.S. Appl. No. 11/268,872, filed Nov. 28, 2005 including prosecution history, including but not limited to, Office Action dated Jul. 2, 2007, Office Action dated Jan. 30, 2008, Office Action dated Sep. 9, 2008, Office Action dated Dec. 14, 2008, and Office Action dated Aug. 20, 2009.

U.S. Appl. No. 11/591,845, filed Nov. 1, 2006 including prosecution history, including but not limited to, Office Action dated Sep. 4, 2008, Office Action dated May 28, 2009, and Notice of Allowance dated Sep. 4, 2009.

U.S. Appl. No. 14/255,799, filed Apr. 17, 2014 including prosecution history, including but not limited to, Office Action dated Dec. 1, 2016, Final Office Action dated Aug. 29, 2017, and Advisory Action dated Dec. 21, 2017.

U.S. Appl. No. 14/939,984, filed Nov. 12, 2015 including prosecution history, including but not limited to, Office Action dated Feb. 3, 2017, and Notice of Allowance dated Jun. 7, 2017.

U.S. Appl. No. 15/342,943, filed Nov. 3, 2016 including prosecution history, including but not limited to Notice of Allowance dated Jun. 13, 2017.

Utriainen et al., "Controlled Electrical Conductivity in $SnO_2$ Thin Films by Oxygen or Hydrocarbon Assisted Atomic Layer Epitaxy," J. Electrochem. Soc. 146(1):189-193 (1999).

Wong et al., "Barriers for copper interconnections," Solid State Technology, 1999, pp. 1-4.

Yang et al., "Atomic Layer Deposition of Tungsten Film from $WF_6/B_2H_6$: Nucleation Layer for Advanced Semiconductor Devices," Advanced Metallization Conference 2001 (AMC 2001), Conference Proceedings ULSI XVII@2002 Materials Research Society, 2001, pp. 655-660.

Zhang et al., "High permittivity thin film nanolaminates," Journal of Applied Physics, vol. 87, No. 4, pp. 1921-1924 (2000).

* cited by examiner

SUBSTRATE PROCESSING METHOD AND DEVICE MANUFACTURED USING THE SAME

CROSS-REFERENCE TO RELATED APPLICATION

This application claims the benefit of U.S. Provisional Application No. 62/490,469, filed on Apr. 26, 2017, in the United States Patent and Trademark Office, the disclosure of which is incorporated herein in its entirety by reference.

BACKGROUND

Field

One or more embodiments relate to a substrate processing method using thin film deposition technology and a device manufactured using the method, and more particularly, to a method of processing a substrate by depositing an insulating layer (e.g., a silicon oxide (SiO) layer and/or a silicon nitride (SiN) layer) on the substrate based on plasma-enhanced atomic layer deposition (PEALD), and a device (e.g., a semiconductor device) manufactured using the method.

Description of the Related Technology

When a device in which micro circuits are generated on a substrate is manufactured, a technology of depositing a thin film on a stepped structure can be used. In particular, high-density integrated circuits of a 3-dimensional semiconductor device can include a trench structure or a stair structure, and deposition of a thin film on selective regions of the structure may be desired.

SUMMARY

One or more embodiments include a substrate processing method that can prevent or minimize certain risks that may occur during processes by depositing a thin film on selective regions of a stepped structure.

Additional aspects will be set forth in part in the description which follows and, in part, will be apparent from the description, or may be learned by practice of the presented embodiments.

According to one or more embodiments, a substrate processing method includes stacking a plurality of stack structures each including an insulating layer and a sacrificial layer, on one another, generating a stair structure by etching the stack structures, generating a separation layer on a side surface of the stair structure, and replacing the sacrificial layer with conductive word line structures, wherein the separation layer is provided between the conductive word line structures.

The substrate processing method may further include generating a pad layer on the sacrificial layer, and generating an interlayer insulating layer on the stair structure, and the generating of the conductive word line structures may include removing the sacrificial layer and the pad layer, and filling a conductive material in spaces from which the sacrificial layer and the pad layer are removed.

A short between the conductive word line structures may be prevented by the separation layer during the filling of the conductive material.

At least one hole connected to the sacrificial layer may be generated during the generating of the interlayer insulating layer, and a conductive protrusion filling the hole may be generated during the generating of the conductive word line structures.

Each of the conductive word line structures may include a first conductive layer extending toward a channel, and a second conductive layer provided on the first conductive layer, and wherein at least a part of a side surface of the first conductive layer is in contact with the separation layer.

The first conductive layer of a conductive word line structure and the second conductive layer of another conductive word line structure may be spaced apart from each other by a height of the separation layer in a vertical direction.

The second conductive layer may include a first protrusion protruding from the first conductive layer, and the first protrusion may be in contact with the separation layer.

The separation layer may have a spacer shape, and a lower surface of the second conductive layer may have a profile corresponding to the spacer shape.

The second conductive layer may further include a second protrusion protruding from an end of the first protrusion in a downward direction.

The second conductive layer may include a first region overlapped with the first conductive layer, and a second region overlapped with the separation layer.

A via contact in contact with the conductive word line structure may be generated, and the via contact may be in contact with the first and second regions of the second conductive layer.

The generating of the separation layer may include generating a first layer on the stair structure, selectively densifying the first layer by applying first energy in such a manner that a portion of the first layer on the side surface of the stair structure is more densified than a portion of the first layer on upper and lower surfaces of the stair structure, and isotropically etching the first layer to remove the portion of the first layer on the upper and lower surfaces of the stair structure and to leave the portion of the first layer on the side surface of the stair structure.

The generating of the pad layer may include generating a second layer on the stair structure, selectively densifying the second layer by applying second energy in such a manner that a portion of the second layer on upper and lower surfaces of the stair structure is more densified than a portion of the second layer on the side surface of the stair structure, and isotropically etching the second layer to remove the portion of the second layer on the side surface of the stair structure and to leave the portion of the second layer on the upper and lower surfaces of the stair structure.

The first energy may be equal to or higher than a preset threshold, and may weaken the portion of the first layer on the upper and lower surfaces of the stair structure.

According to one or more embodiments, a substrate processing method of a substrate including a stair pattern generated by alternately stacking first silicon oxide layers and first silicon nitride layers includes generating a second silicon oxide layer on an upper surface and a side wall of the stair pattern, removing the second silicon oxide layer generated on the upper surface of the stair pattern without completely removing the second silicon oxide layer from the side wall, and replacing the first silicon nitride layers with metal.

A thickness of a silicon nitride layer in the lower region of the stair pattern may be greater than a thickness of a silicon nitride layer in the upper region of the stair pattern.

The second silicon oxide layer remaining on the side wall may be provided between word lines, and prevents a short between the word lines.

The metal may have an overfilled structure and serves as word lines.

To generate the overfilled structure, the replacing of the first silicon nitride layers with the metal may include generating a second silicon nitride layer on the remaining second silicon oxide layer, removing the second silicon nitride layer generated on the second silicon oxide layer without completely removing the second silicon nitride layer from the first silicon nitride layers, and replacing the first silicon nitride layers and the second silicon nitride layer with the metal.

According to one or more embodiments, a semiconductor device includes a substrate, at least one memory cell string protruding and extending in an upward direction from the substrate, a first word line connected to a first memory cell of the memory cell string, and a second word line connected to a second memory cell of the memory cell string, wherein at least one of the first and second word lines includes a first conductive layer extending toward a channel, and a second conductive layer provided on the first conductive layer, and wherein the second conductive layer includes a first protrusion protruding from the first conductive layer in a horizontal direction.

The second conductive layer may further include a second protrusion protruding from an end of the first protrusion in a downward direction.

According to one or more embodiments, a method for processing a substrate for selective formation of layers on a sidewall includes depositing a conformal layer over a horizontal surface and a sidewall surface of the substrate. The deposited layer is plasma treated to weaken portions on the horizontal surface, leaving a layer that is susceptible to being completely removed from the horizontal surface and incompletely removed from the sidewall surface by isotropic etching.

The method may include conducting the isotropic etching to leave a sidewall spacer structure from the deposited layer on the sidewall. The plasma treatment may employ a high density, anisotropic plasma.

According to one or more embodiments, a method for processing a substrate for selective formation of layers on a horizontal surface includes depositing a conformal layer over the horizontal surface and a sidewall surface of the substrate. The deposited layer is plasma treated to densify portions on the upper surface, leaving a layer that is susceptible to being completely removed from the sidewall surface and incompletely removed from the horizontal surface by isotropic etching.

The method may include conducting the isotropic etching to leave a selective horizontal portion of the deposited layer on the horizontal surface. The plasma treatment may employ a low density, anisotropic plasma.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION

Figure 1:
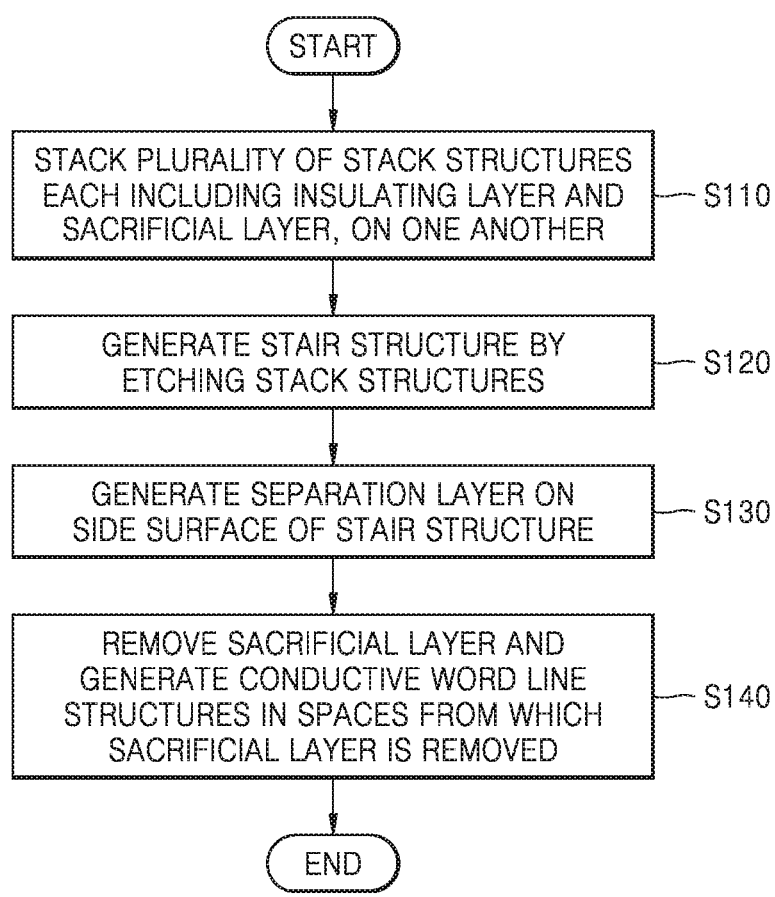
FIG. 1 is a flowchart of a substrate processing method according to embodiments of the present disclosure.

Hereinafter, the present disclosure will be described in detail by explaining embodiments of the disclosure with reference to the attached drawings.

The disclosure may, however, be embodied in many different forms and should not be construed as being limited to the embodiments set forth herein; rather, these embodiments are provided so that this disclosure will be thorough and complete, and will fully convey the concept of the disclosure to one of ordinary skill in the art.

The terminology used herein is for the purpose of describing particular embodiments and is not intended to limit the disclosure. As used herein, the singular forms "a", "an", and "the" are intended to include the plural forms as well, unless the context clearly indicates otherwise. It will be further understood that the terms "comprises" and/or "comprising", when used in this disclosure, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

In this disclosure, the term "gas" may include an evaporated solid and/or liquid, and may be configured as a single gas or a mixture of gases. Herein, a process gas provided into a reaction chamber through a shower head may include a precursor gas and an additive gas. The precursor gas and the additive gas may be generally provided into the reaction space as a mixture gas or separate gases. The precursor gas may be provided together with a carrier gas such as an inert gas. The additive gas may include a reactant gas and a diluting gas such as an inert gas. The reactant gas and the diluting gas may be provided into the reaction space as a mixture gas or separate gases. The precursor may include two or more precursors, and the reactant gas may include two or more reactant gases. The precursor is a gas which is chemisorbed on a substrate, configures a main structure of a matrix of a dielectric layer, and generally contains metalloid or a metallic element, and the reactant gas for deposition is a gas which reacts with the precursor chemisorbed on the substrate when the gas is excited to fix an atomic layer or a monolayer on the substrate. The term "chemisorption" refers to chemical saturation adsorption. A gas other than the process gas, i.e., a gas provided without passing through the shower head may be used to seal the reaction space, and includes a seal gas such as an inert gas. In some embodiments, the term "film" refers to a layer which is continuously extending in a direction perpendicular to a thickness direction without pinholes to cover a whole target or a related surface, or a layer which simply covers a target or a related surface. In some embodiments, the term "layer" refers to a structure generated on a surface and having a certain thickness, is used as a synonym for film, or refers to a non-film structure. A film or layer may include a discontinuous single film or layer having certain characteristics, or multiple films or layers. The boundary of adjacent films or layers may be clear or not clear, and may be set based on physical, chemical, and/or other characteristics, generating processes or sequences, and/or functions or purposes of adjacent films or layers.

In this disclosure, the expression "same material" should be interpreted that a main constituent is the same. For example, when both a first layer and a second layer are silicon nitride layers and are made of the same material, the first layer may be made of one selected from the group consisting of $Si_2N$, SiN, $Si_3N_4$, and $Si_2N_3$, and the second layer may also be made of one selected from the group but may have a structure different from that of the first layer.

Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, one of ordinary skill in the art can readily provide such conditions and/or structures, in view of the present disclosure, as a matter of experimentation. In all disclosed embodiments, any element used in an embodiment can be replaced with any elements equivalent thereto, including those explicitly, necessarily, or inherently disclosed herein, for the intended purposes. Further, the present disclosure may be equally applied to devices and methods.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, the embodiments of the disclosure should not be construed as limited to the particular shapes of regions illustrated herein, but are to include deviations in shapes that result, for example, from manufacturing.

FIG. 1 is a flowchart of a substrate processing method according to embodiments of the present disclosure.

Referring to FIG. 1, a plurality of stack structures each including an insulating layer and a sacrificial layer are stacked on one another (S110). For example, the insulating layer may be a silicon oxide (SiO) layer, and the sacrificial layer may be a silicon nitride (SiN) layer. However, the present disclosure is not limited thereto, and the insulating layer and the sacrificial layer may be made of arbitrary materials having different etching selectivity ratios.

Then, a stair structure is generated by etching ends of the stack structures each including the insulating layer and the sacrificial layer (S120). The stair structure may include a plurality of steps and, for example, each step may include one insulating layer and one sacrificial layer. The stair structure may be generated using, for example, reactive ion etching and resist sliming.

After that, separation layers are generated on a side surface of the stair structure (e.g., an inclined surface provided between upper and lower surfaces of the stair structure to connect the upper and lower surfaces) (S130). The separation layers may be generated to cover at least parts of the side surface of the stair structure and expose at least parts of the upper (and lower) surfaces of the stair structure. The separation layers may be generated using an atomic layer deposition (ALD) process and, more particularly, using a plasma-enhanced atomic layer deposition (PEALD) process.

The separation layers generated to cover the side surface of the stair structure may separate one step from another step. The separation layer generated to expose the upper and lower surfaces of the stair structure may separate a pad layer from an adjacent step (i.e., a step adjacent to the pad layer in a horizontal direction). The above functions of the separation layers will be described in detail below.

Then, the sacrificial layers replaced with conductive word line structure. In the illustrated process, the sacrificial layers are removed, and conductive word line structures are generated in spaces from which the sacrificial layers are removed (S140). The conductive word line structures may include tungsten or a material selected from or a combination of various conductive materials such as copper and polysilicon. Example embodiments for generating the conductive word line structures will be described in detail below.

By performing the above-described operations, the separation layers may be provided between the conductive word line structures. The separation layers electrically separate the conductive word line structures from each other. Therefore, when the conductive word line structures are generated, electrical connection therebetween may be prevented by the separation layers.

FIGS. 2 to 10 are cross-sectional diagrams for describing a substrate processing method according to other embodiments of the present disclosure. The substrate processing method according to the current embodiments may be a modified example of the substrate processing method according to the previous embodiments. Repeated descriptions therebetween will not be provided herein.

Figure 2:
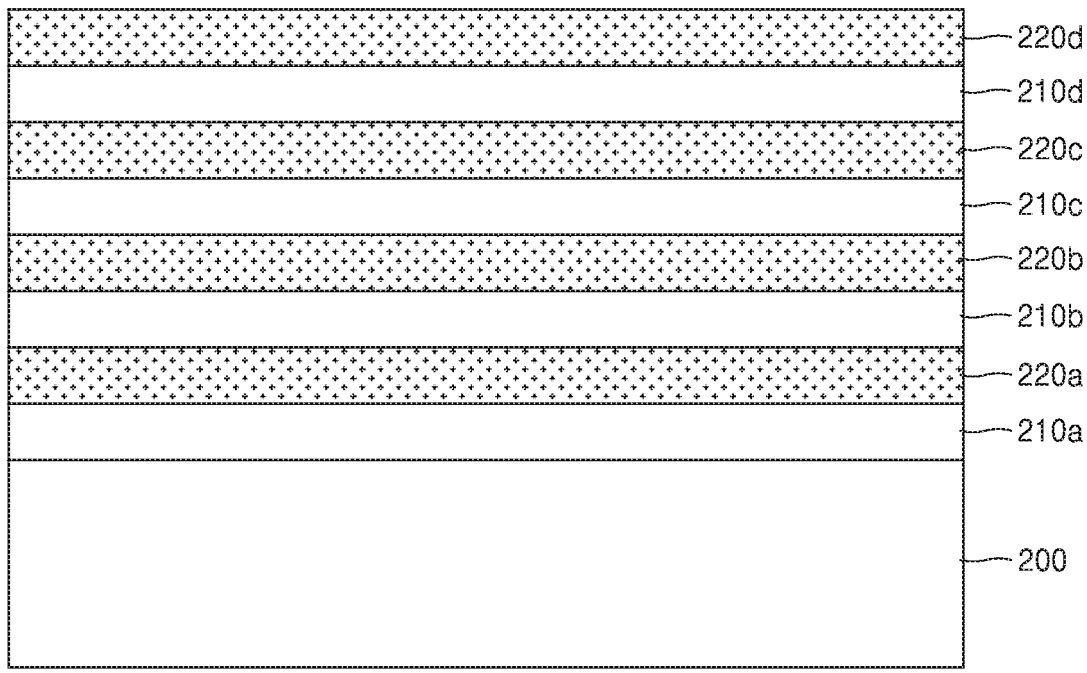
FIGS. 2, 3, 4, 5, 6, 7, 8, 9 and 10 are cross-sectional diagrams for describing a substrate processing method according to other embodiments of the present disclosure.

Referring to FIG. 2, a plurality of stack structures including insulating layers 210a, 210b, 210c, and 210d (hereinafter, collectively referred to as "210") and sacrificial layers 220a, 220b, 220c, and 220d (hereinafter, collectively referred to as "220"). Each stack structure includes a pair of an insulating layer (210a, 210b, 210c, or 210d) and a sacrificial layer (220a, 220b, 220c, or 220d). The insulating layer 210 and the sacrificial layer 220 are stacked on one another on a substrate 200. Although not shown in FIG. 2, channel holes may be generated by etching the insulating layers 210 and the sacrificial layers 220 from some regions of the stack structures, and at least a part of elements of memory cell strings (see MCS of FIG. 11) may be generated in the channel holes. The memory cell strings may include elements such as channels, gate conductive layers, and gate insulating layers.

The process for generating elements of the memory cell strings may be performed by directly generating at least a part of the channels, the gate conductive layers, and the gate insulating layers, or by generating sacrificial layers in the channel holes to allow the channels, the gate conductive layers, and the gate insulating layers to be generated in a subsequent process, or both.

Figure 3:
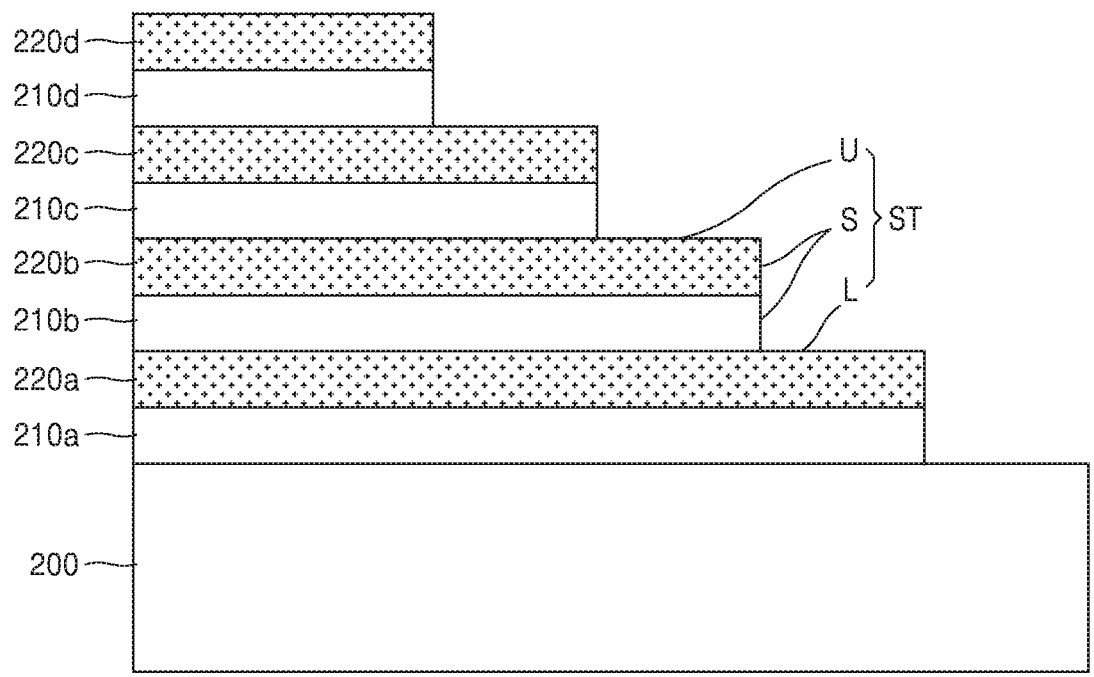

Then, as shown in FIG. 3, a stair structure is generated by etching the stack structures. As described above, the stair structure may include a plurality of steps, and each step may have an upper surface (or a first horizontal surface), a lower surface (or a second horizontal surface), and a side surface (or a vertical surface) connecting the upper and lower surfaces. For example, the stair structure may include one or more steps ST, and one step ST may have an upper surface U on a sacrificial layer 220b, a lower surface L on a sacrificial layer 220a, and a side surface S connecting the upper and lower surfaces U and L.

Figure 4:
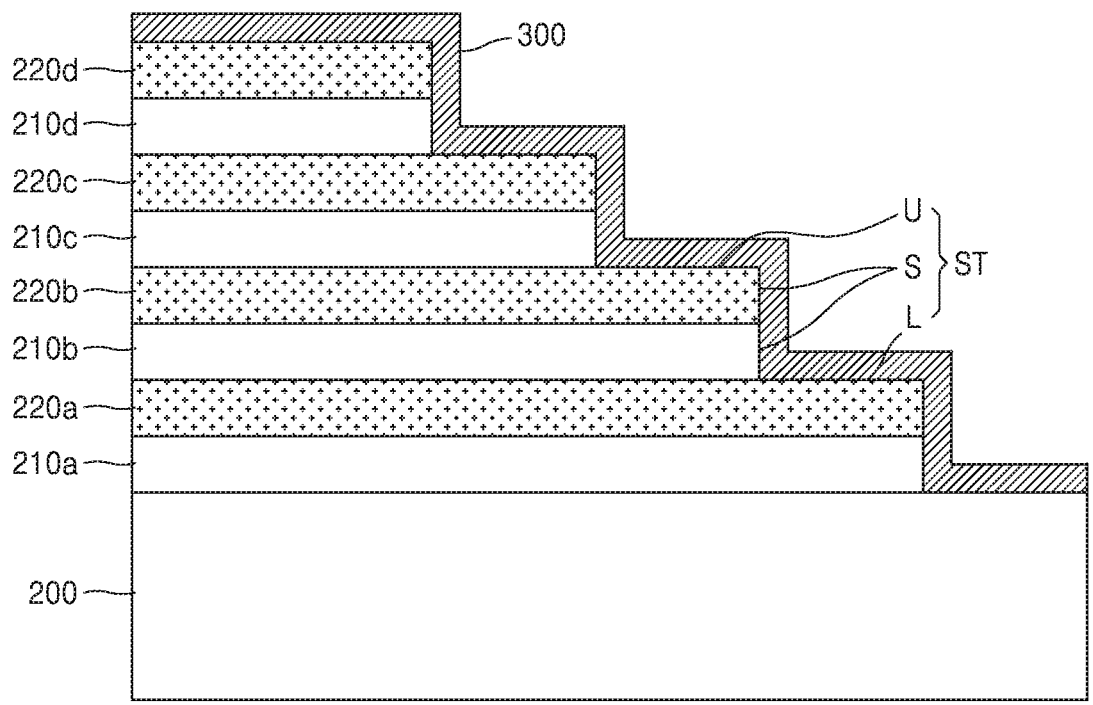

After that, separation layers are generated on the side surface of the stair structure. To this end, as shown in FIG. 4, a first layer 300 is initially generated on the stair structure. Although the first layer 300 is illustrated as a single layer in FIG. 4, the first layer 300 may also include multiple layers. The first layer 300 may be made of, for example, a material the same as that of the insulating layers 210. In addition, the first layer 300 may be made of, for example, a material different from that of the sacrificial layers 220. In another embodiment, the first layer 300 may be made of a material different from those of the insulating layers 210 and the sacrificial layers 220.

The first layer 300 may be generated using a PEALD process mentioned above in relation to the previous embodiments. In an example embodiment, for the first layer 300, the PEALD process may be performed by maintaining a high plasma density condition. For example, the ALD process of the first layer 300 may be performed by applying high plasma power. This condition (e.g., high plasma density or high plasma power) may lead to layer breakage due to ions. Therefore, an upper surface of the first layer 300 other than a side surface of the first layer 300 may be weakened due to application of plasma, and the first layer 300 may be selectively removed during a subsequent isotropic etching process. Thus, a blanket deposition and plasma treatment can selectively render the horizontal (upper/lower) portions of the deposited first layer 300 susceptible to subsequent etching than vertical (side) portions of the deposited first layer, such that spacers can be formed by a subsequent isotropic etch (see FIG. 5 and text) rather than a directional etch.

Plasma may be applied during the ALD process, and/or in a plasma post-treatment operation. That is, plasma may be applied during, after, or during and after the operation of generating the first layer 300.

Figure 5:
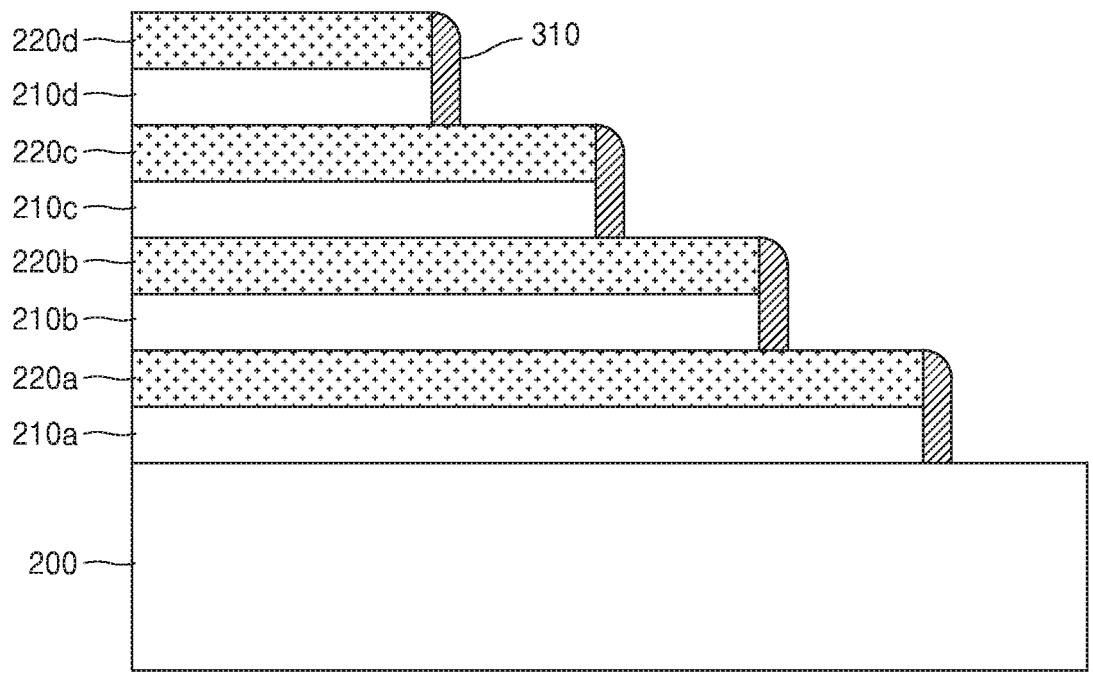

Then, referring to FIG. 5, an isotropic etching process is performed on the first layer 300 (see FIG. 4). As described above, the upper surface of the first layer 300 may be weakened due to application of plasma in a certain condition, and thus the first layer 300 generated on the side surface of the stair structure may remain even though the isotropic etching process is performed. Consequently, during the isotropic etching process of the first layer 300 (see FIG. 4), portions of the first layer 300 on the upper and lower surfaces of the stair structure may be removed, and portions of the first layer 300 on the side surface of the stair structure may remain.

Separation layers 310 may be defined as the remaining portions of the first layer 300. Each separation layer 310 may be generated to cover a side surface of one sacrificial layer 220 and a part of an upper surface of another sacrificial layer 220. In an embodiment, the separation layers 310 may have a spacer shape due to the isotropic etching process. Therefore, pad layers (see 330 of FIG. 7) to be subsequently generated may have a profile corresponding to the spacer shape of the separation layers 310. As described above, the spacer shape of the separation layers 310 can be accomplished as described above even though an isotropic etch is employed, in contrast to highly energetic and damaging conventional directional (anisotropic) spacer etching.

Figure 6:
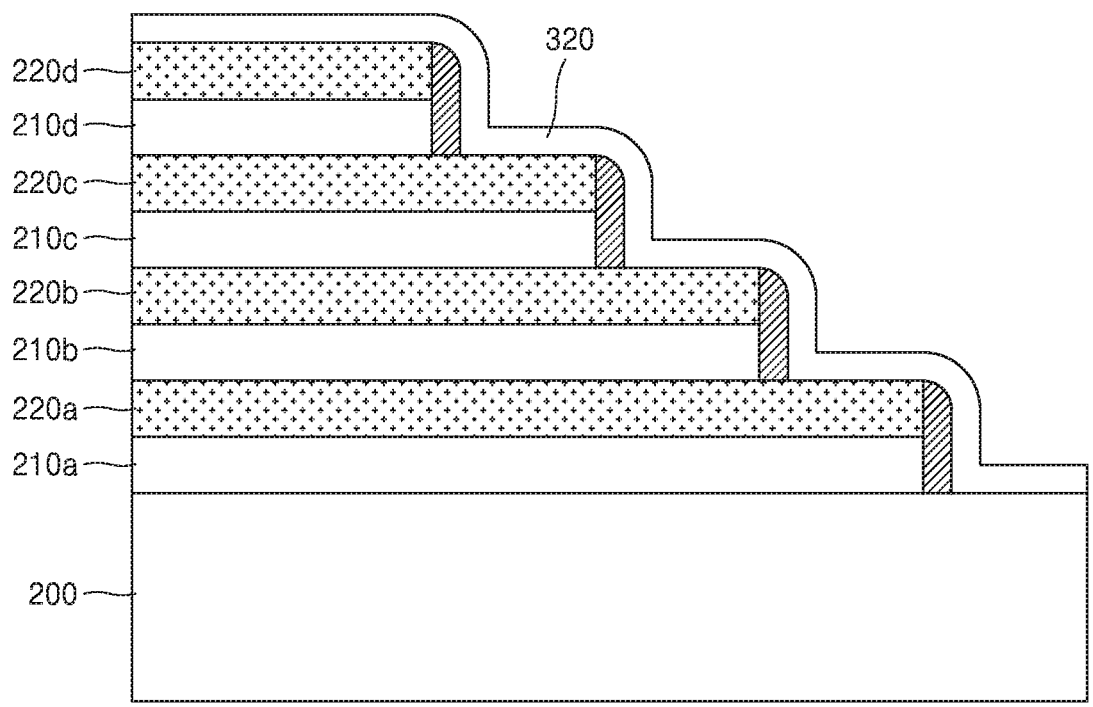

Thereafter, pad layers are generated on the sacrificial layers 220 (it is noted that the pad layers are included in the sacrificial layers 220 and may also be referred to as the sacrificial layers 220 in this disclosure). The pad layers may be generated before conductive word line structures are generated. To this end, as shown in FIG. 6, a second layer 320 is generated on the sacrificial layers 220 and the separation layers 310. Although the second layer 320 is illustrated as a single layer in FIG. 6, the second layer 320 may also be generated as multiple layers. The second layer 320 may be made of, for example, a material the same as that of the sacrificial layers 220. In addition, the second layer 320 may be made of, for example, a material different from that of the insulating layers 210.

The second layer 320 may be generated by using a PEALD process mentioned above in relation to the previous embodiments. In an example embodiment, for the second layer 320, the PEALD process may be performed by maintaining a low plasma density condition. For example, the ALD process of the second layer 320 may be performed by applying low plasma power. This condition (e.g., low plasma density or low plasma power) may lead to layer densification due to ions. Therefore, an upper surface of the second layer 320, or horizontal portions, may be densified due to application of plasma, relative to vertical portions, and the second layer 320 may be selectively removed during a subsequent isotropic etching process. Thus, the deposition may leave portions of the second layer 320 on the vertical surfaces more susceptible to etching, compared to portions on the horizontal surfaces, which are relatively less susceptible to the subsequent etching.

Plasma may be applied during the ALD process, and/or in a plasma post-treatment operation. That is, plasma may be applied during, after, or during and after the operation of generating the second layer 320.

In an example embodiment, plasma may be applied using an inert gas such as argon and/or a gas having a constituent of the sacrificial layers 220 (e.g., nitrogen in a case when the second layer 320 is a SiN layer). Densification using application of plasma may be performed by applying directional plasma. Due to the directivity of plasma ions, portions of the second layer 320, which are generated on the horizontal upper and lower surfaces U and L of the stair structure, may be densified relative to portions of the second layer 320 on the vertical sidewalls. Therefore, the second layer 320 on the stair structure may be selectively etched during a subsequent isotropic etching process.

Figure 7:
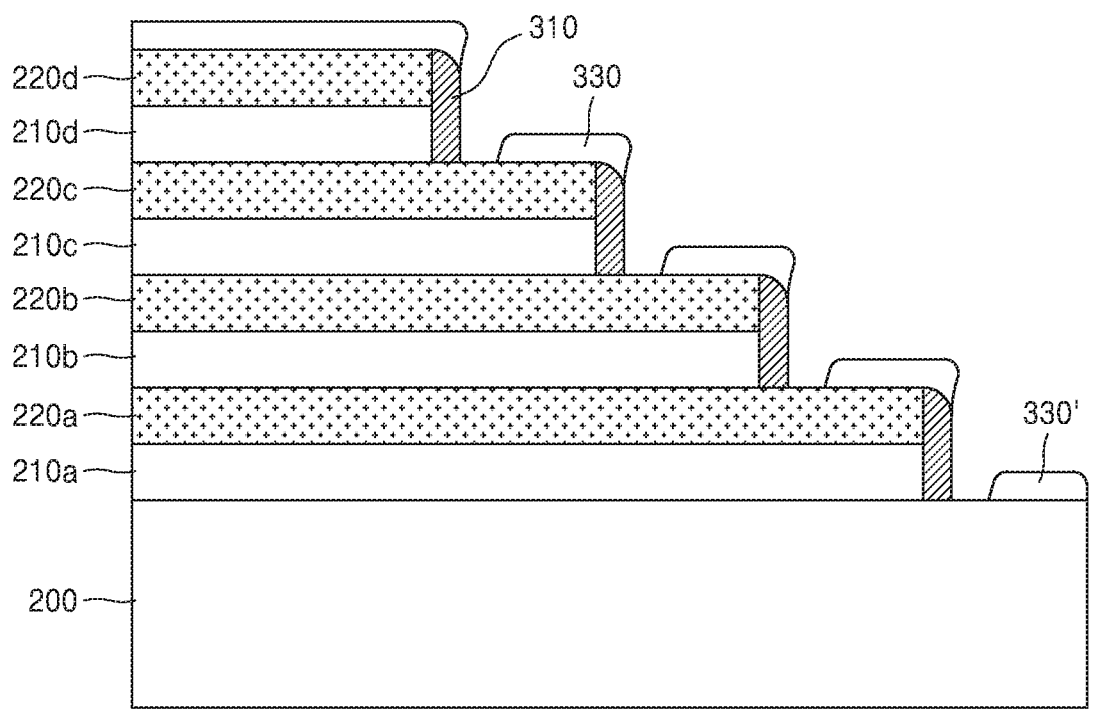

Then, referring to FIG. 7, an isotropic etching process is performed on the second layer 320 (see FIG. 6). As described above, the upper surface of the second layer 320 may be densified due to application of plasma in a certain condition, and thus the second layer 320 generated on the upper surface of the stair structure may remain even though the isotropic etching process is performed. Consequently, during the isotropic etching process of the second layer 320, portions of the second layer 320 on the upper and lower surfaces of the stair structure may remain, and portions of the second layer 320 on the side surface of the stair structure may be removed.

Application of plasma is described as an example in the above descriptions, but it is noted that the present disclosure is not limited thereto. The first and second layers may be selectively densified and/or weakened by applying a selectived type of energy. For example, portions of the first layer on the upper and lower (horizontal) surfaces of the first layer may be weakened by supplying energy equal to or higher than a preset threshold during a first energy application process. As another example, portions of the second layer on the (horizontal) upper and lower surfaces of the second layer may be densified by supplying energy equal to or lower than a preset threshold during a second energy application process. As shown in FIGS. 6 and 7, densification of horizontal portions on the upwardly facing surfaces, relative to vertical portions on the sidewalls, can render the deposited layer more susceptible to selective etching of the vertical portions with an isotropic etch. In contrast, as shown in FIGS. 4 and 5, weakening of horizontal portions on the upwardly facing surfaces, relative to vertical portions on the sidewalls, can render the deposited layer more susceptible to selective etching of the horizontal portions with an isotropic etch.

As described above, to generate the separation layers 310 (i.e., to generate layers remaining on the side surface of the stair structure), plasma of a high density may be applied during the operation of generating the first layer 300 and, to generate the pad layers 330 (i.e., to generate layers remaining on the upper/lower surfaces of the stair structure), plasma of a low density may be applied during the operation of generating the second layer 320. Therefore, the density of plasma supplied during the operation of generating the first layer 300 may be higher than the density of plasma supplied during the operation of generating the second layer 320.

Figure 8:
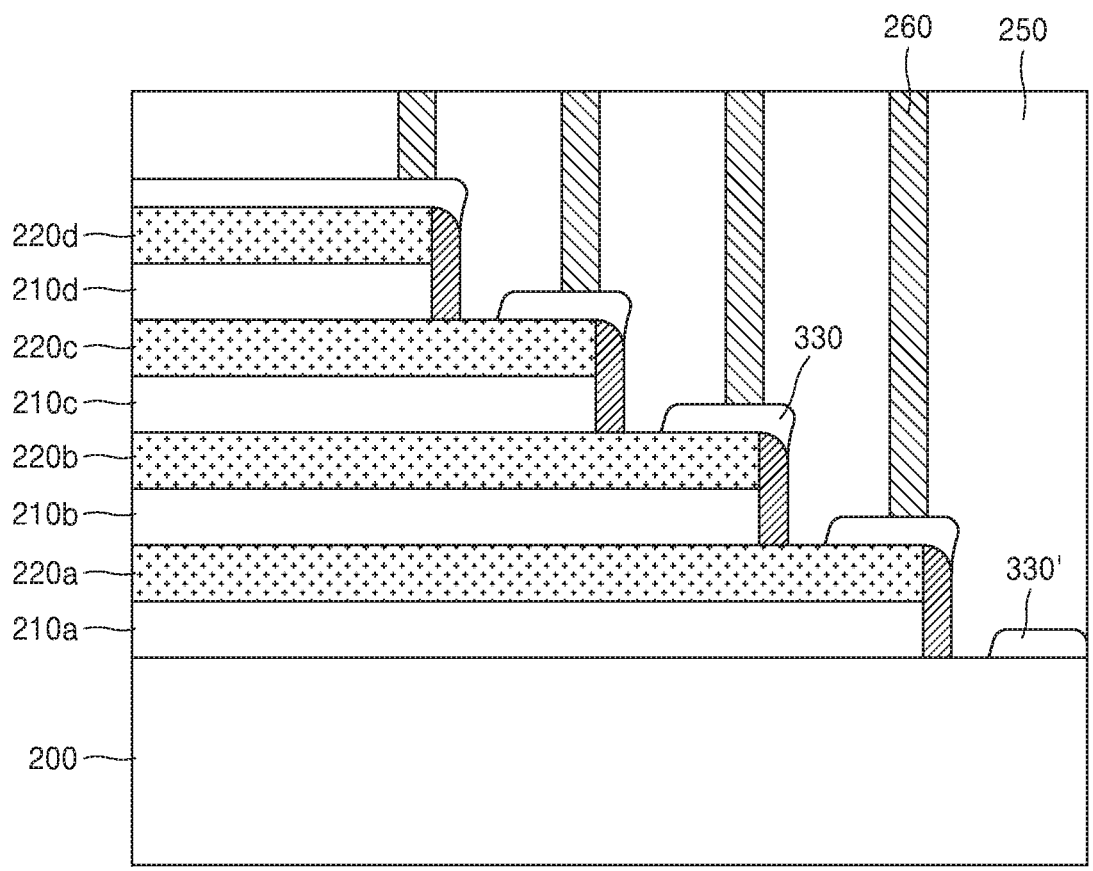
Figure 9:
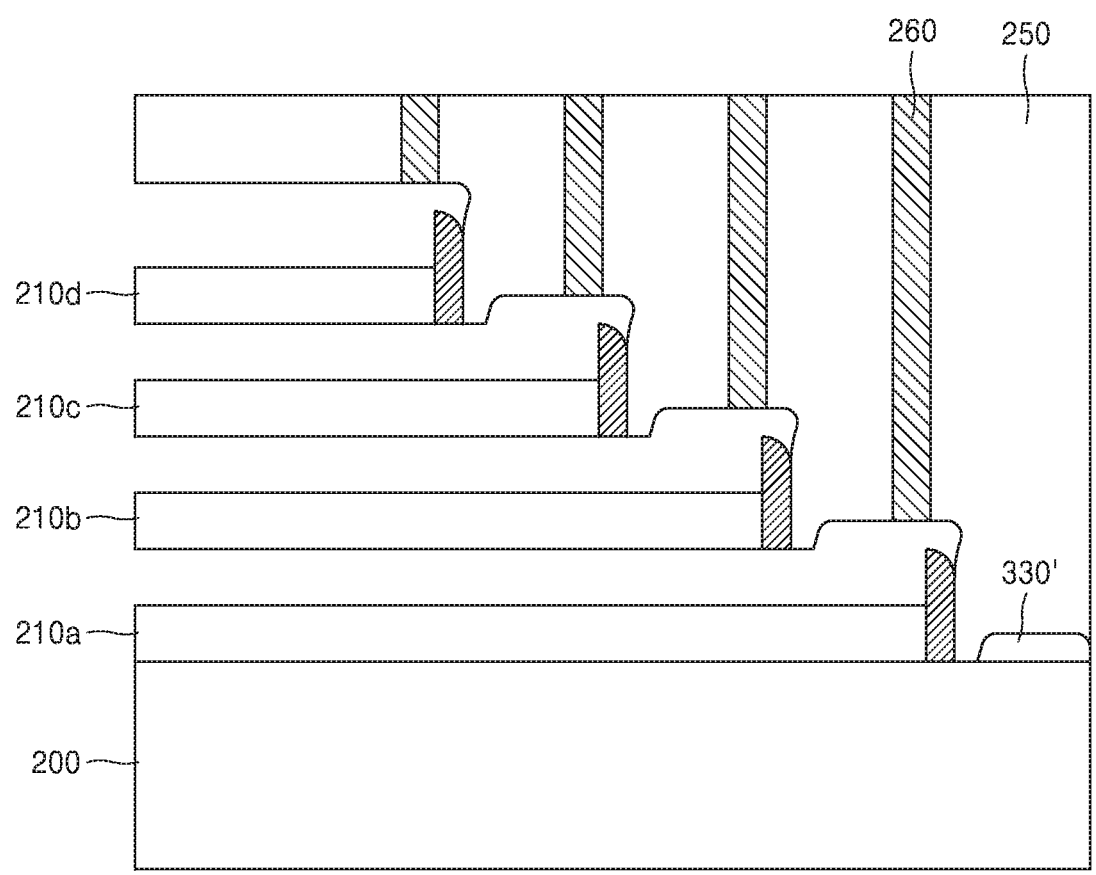

After the separation layers 310 and the pad layers 330 are generated, an interlayer insulating layer 250 is generated on the stair structure. As shown in FIG. 8, the interlayer insulating layer 250 is generated on the stair structure after the isotropic etching processes. The interlayer insulating layer 250 may be made of a material the same as that of the insulating layers 210 located between the sacrificial layers 220 of the stair structure. For example, the sacrificial layers 220 of the stair structure may be SiN layers, the insulating layers 210 of the stair structure may be SiO layers, and the interlayer insulating layer 250 may be a SiO layer.

During the operation of generating the interlayer insulating layer 250, at least one hole connecting the sacrificial layer 220 and the separation layer 310 may be generated. Alternatively, at least one hole connecting the pad layer 330 and the separation layer 310 may be generated. The hole should not be generated in principle, but may be generated when the distance between the sacrificial layer 220 and the separation layer 310 (or if the separation layer 310 is not present, the distance between the sacrificial layer 220 and an adjacent structure) is short and when a raw material gas for generating the interlayer insulating layer 250 is incompletely filled in a small space therebetween.

The hole may be connected to at least one of the sacrificial layer 220 and the separation layer 310. In particular, the hole may be connected to the sacrificial layer 220. Due to the hole connected to the sacrificial layer 220, a conductive protrusion may be generated during a subsequent operation of generating conductive word line structures. A detailed description of such a hole and how a short circuit can be nevertheless avoided will be provided below with reference to FIGS. 12 to 14.

Referring back to FIG. 8, then, via contacts 260 connected to at least parts of the sacrificial layers 220 (including a pad layer 330) are generated by patterning an upper surface of the interlayer insulating layer 250. In an optional embodiment, the via contacts 260 may be generated after conductive word line structures are generated by etching the sacrificial layers 220.

Subsequently, conductive word line structures are generated. The word line structures may replace the sacrificial layers 220 and the pad layers 330. Initially, referring to FIG. 9, the sacrificial layers 220 (see FIG. 8) and the pad layers 330 (see FIG. 8) are removed. For example, the sacrificial layers 220 and the pad layers 330 are selectively etched to expose channels (not shown), the insulating layers 210, the interlayer insulating layer 250, and the via contacts 260. As such, sacrificial word line structures including the sacrificial layers 220 (see FIG. 8) and the pad layers 330 (see FIG. 8) may be removed. In an optional embodiment, during the operation of etching the sacrificial layers 220 and the pad layers 330, a pad layer 330' (see FIG. 8) generated on the substrate 200 may also be etched, and thus a part of an upper surface of the substrate 200 may be exposed.

Figure 10:
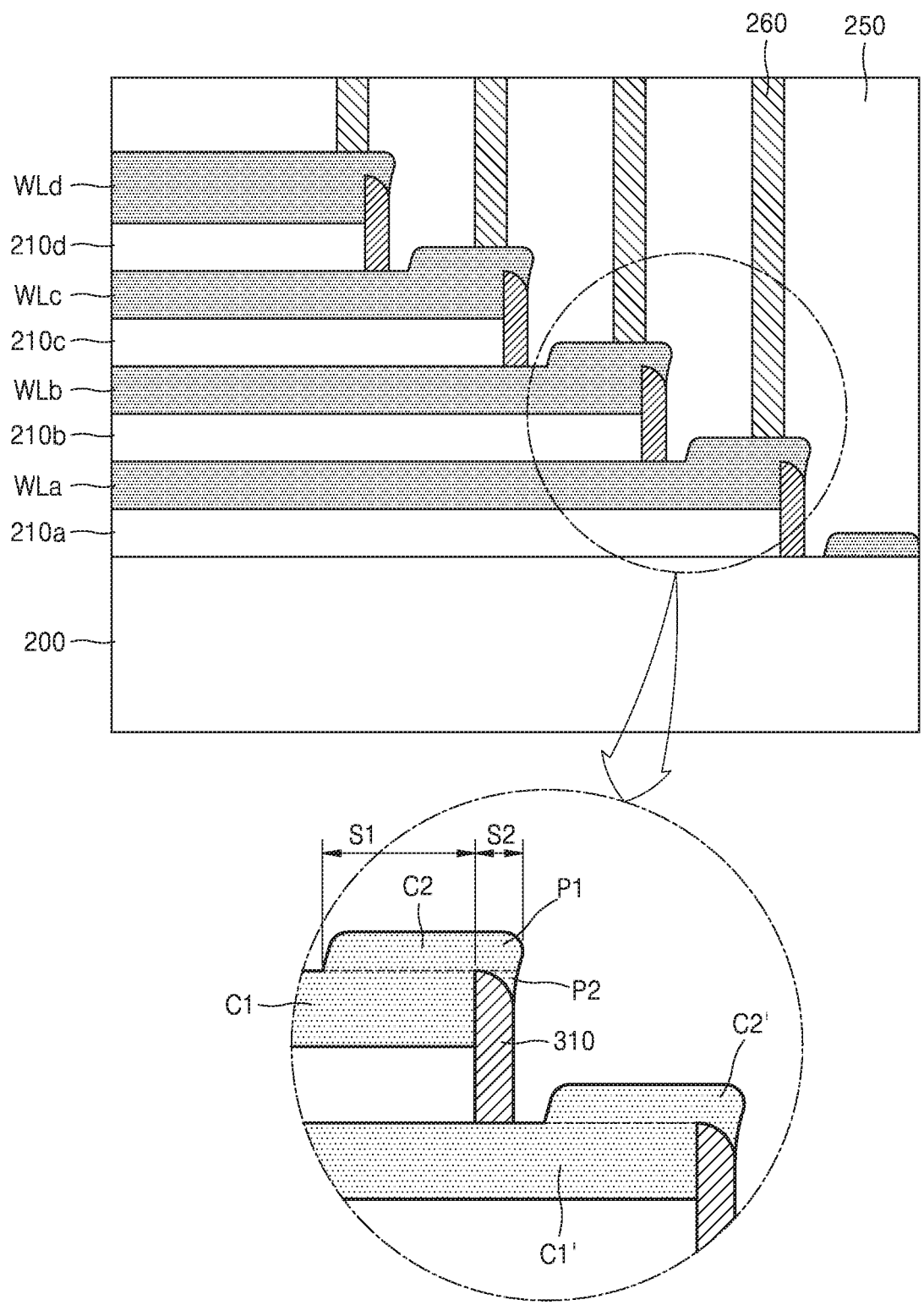

Referring to FIG. 10, conductive word line structures WLa, WLb, WLc and WLd (hereinafter, collectively referred to as "WL") are generated in exposed spaces. The conductive word line structures WL may be generated to correspond to the spaces from which the sacrificial word line structures are removed. That is, the conductive word line structures WL may be generated by filling a conductive material in the spaces from which the sacrificial layers 220 and the pad layers 330 are removed.

Each of the conductive word line structures WL generated as described above may include a first conductive layer C1 extending toward a channel, and a second conductive layer C2 provided on the first conductive layer C1. In other words, the conductive word line structure WL may include the first conductive layer C1 corresponding to the sacrificial layer 220 (see FIG. 8) and the second conductive layer C2 corresponding to the pad layer 330 (see FIG. 8). The conductive word line structures WL each including the first conductive layer C1 and the second conductive layer C2 provided on the first conductive layer C1 are referred to as overfilled structures, which can be seen in FIG. 10 to extend above the spacer-shaped separation layers 310 and can serve as extended landing pads for the vias 260, as described below.

At least a part of a side surface of the first conductive layer C1 may be in contact with the separation layer 310. Due to such contact, the first conductive layer C1 of one conductive word line structure WL may be separated from a second conductive layer C2' of another conductive word line structure WL. Therefore, during the operation of filling the conductive material, an electrical short circuit between two conductive word line structures WL may be prevented or minimized by the separation layers 310.

The second conductive layer C2 may include a first protrusion P1 protruding from the first conductive layer C1 in a horizontal direction. The first protrusion P1 may be in contact with the separation layer 310. For example, a lower surface of the first protrusion P1 may be in contact with an upper surface of the separation layer 310. Due to such contact, a lower surface of the second conductive layer C2 may have a shape corresponding to an upper surface profile of the separation layer 310. For example, the separation layer 310 may have a spacer shape due to an isotropic etching process and, in this case, the lower surface of the second conductive layer C2 may have a profile corresponding to the spacer shape.

In an optional embodiment, the second conductive layer C2 may include a second protrusion P2 protruding from an end of the first protrusion P1 in a downward direction. The second protrusion P2 may be generated due to, for example, the above-described separation layer 310 having a spacer shape.

According to some embodiments, the separation layers 310 are generated to prevent or minimize the risks of a short circuit between conductive word line structures WL. Due to the separation layers 310, a device manufactured using the substrate processing method as described herein may have various features.

For example, the second conductive layer C2 of the conductive word line structure WL may include a first region S1 overlapped with the first conductive layer C1, and a second region S2 overlapped with the separation layer 310. Therefore, the length of the second conductive layer C2 may be increased by the width of the separation layer 310, and alignment between the via contact 260 in contact with the conductive word line structure WL, and the second conductive layer C2 may be improved. In this case, the via contact 260 may be in contact with both the first and second regions S1 and S2 of the second conductive layer C2.

As another example, a first conductive layer C1' of one conductive word line structure WL may be spaced apart from the second conductive layer C2 of another conductive word line structure WL by the height of the separation layer 310 in a vertical direction. This corresponds to a structural feature occurring because the separation layer 310 is generated before the second conductive layer C2 is generated. In addition, the first conductive layer C1 of one conductive word line structure WL may be spaced apart from the second conductive layer C2' of another conductive word line structure WL by at least the width of the separation layer 310 in a horizontal direction.

As described above, by providing separation layers between conductive word line structures, the conductive word line structures may be electrically separated from each other and may be spaced apart from each other by a sufficient distance. In addition, the separation layers may serve as an etching mask during a second layer isotropic etching process performed during a pad layer generating process, and thus the second layer isotropic etching process for generating pad layers may be sufficiently performed without damaging sacrificial layers due to isotropic etching.

Figure 11:
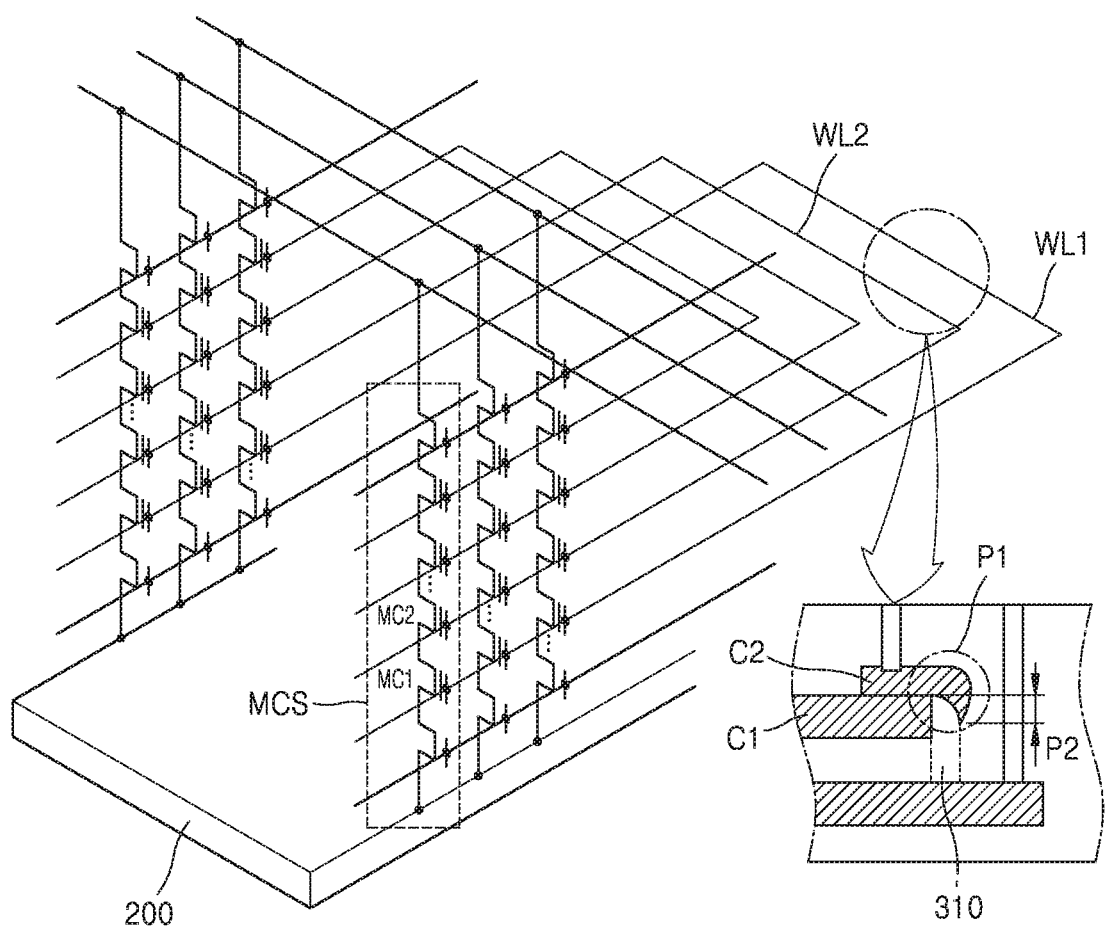
FIG. 11 is a circuit diagram of a semiconductor device according to embodiments of the present disclosure.

FIG. 11 is a circuit diagram of a semiconductor device according to embodiments of the present disclosure. The semiconductor device may be generated using the substrate processing method according to the previous embodiments. Repeated descriptions therebetween will not be provided herein.

Referring to FIG. 11, the semiconductor device (e.g., a semiconductor memory device) may include the substrate 200, memory cell strings MCS, a first word line WL1, and a second word line WL2.

The memory cell strings MCS may protrude and extend in an upward direction from the substrate 200. Each of the memory cell strings MCS may include a plurality of memory cells. Although only four memory cells are illustrated in FIG. 11, if necessary, a smaller or larger number of memory cells may be included in one memory cell string MCS.

The first word line WL1 may be connected to the first memory cell MC1. For example, the first word line WL1 may be generated to extend toward a channel of the first memory cell MC1 Likewise, the second word line WL2 may be connected to the second memory cell MC2, and may be generated to extend toward a channel of the second memory cell MC2.

At least one of the first and second word lines WL1 and WL2 may include word line structures generated by performing the operations described above in relation to FIGS. 2 to 10. Therefore, at least one of the first and second word lines WL1 and WL2 may include the first conductive layer C1 extending toward a channel, and the second conductive layer C2 provided on the first conductive layer C1, and the second conductive layer C2 may include the first protrusion P1 protruding from the first conductive layer C1 in a horizontal direction. The second conductive layer C2 may further include the second protrusion P2 protruding from an end of the first protrusion P1 in a downward direction.

The above-described shapes of the first and second protrusions P1 and P2 are caused by generation of the separation layer 310. That is, the pad layer 330 may be generated along an upper surface of the separation layer 310 having a spacer shape and the second conductive layer C2 may be generated to correspond to the pad layer 330, thereby generating the first and second protrusions P1 and P2.

Structural features related to word lines are described above in relation to FIG. 11, but it is noted that the present disclosure is not limited thereto. The semiconductor device of FIG. 11 according to embodiments of the present disclosure may include some or all features of the above-described methods unless the features contradict each other.

Figure 12:
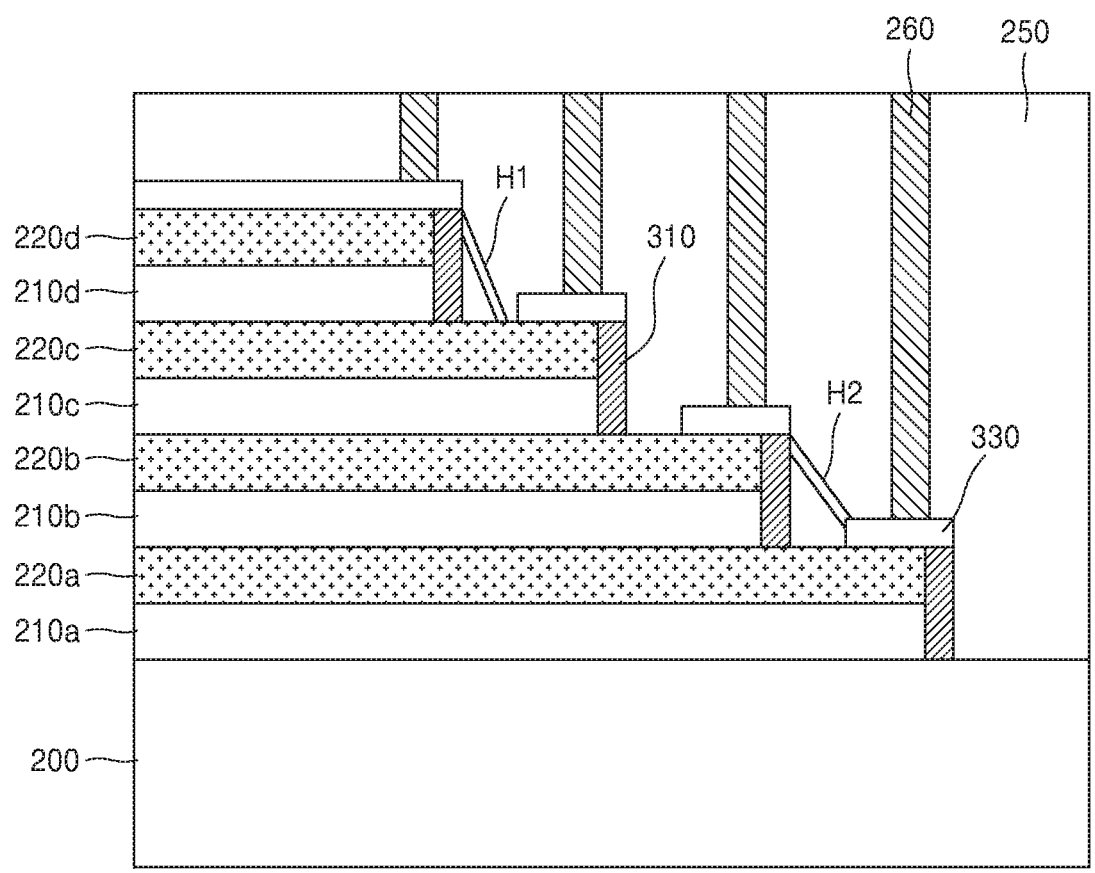
FIGS. 12, 13 and 14 are cross-sectional diagrams for describing a substrate processing method according to other embodiments of the present disclosure.
Figure 13:
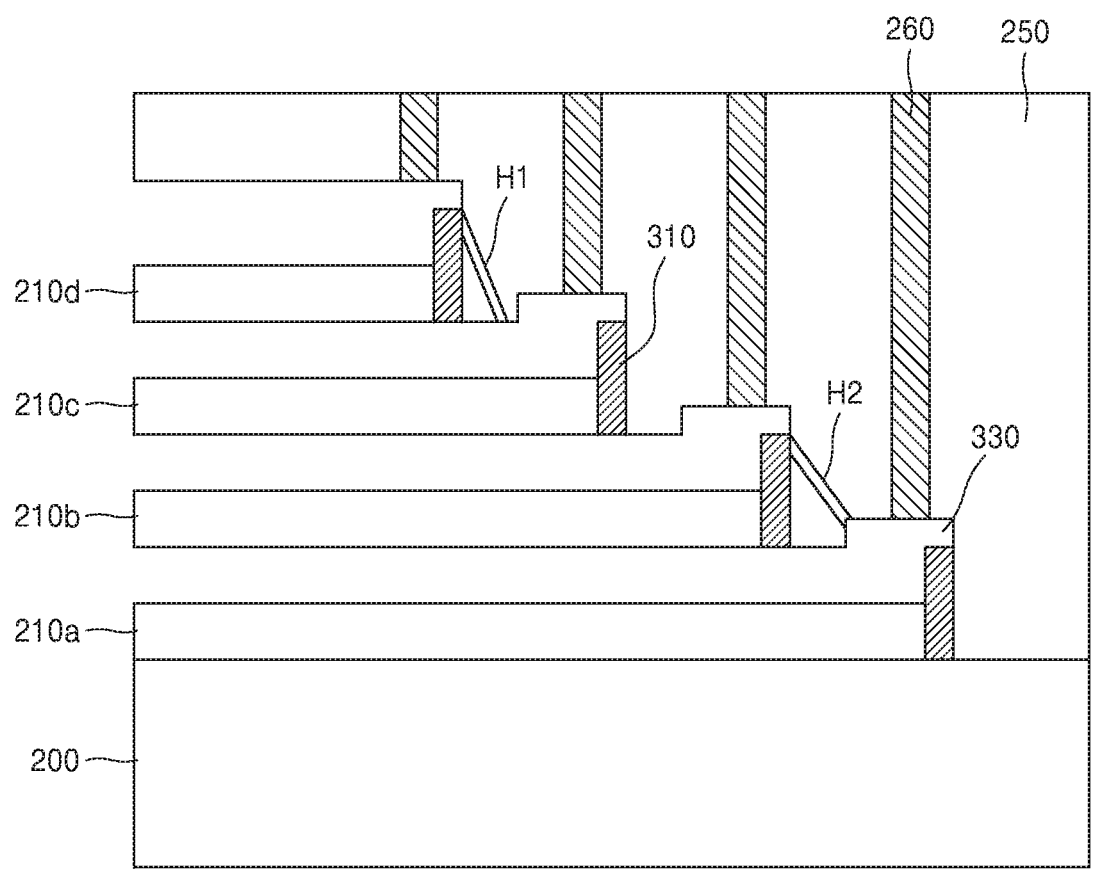
Figure 14:
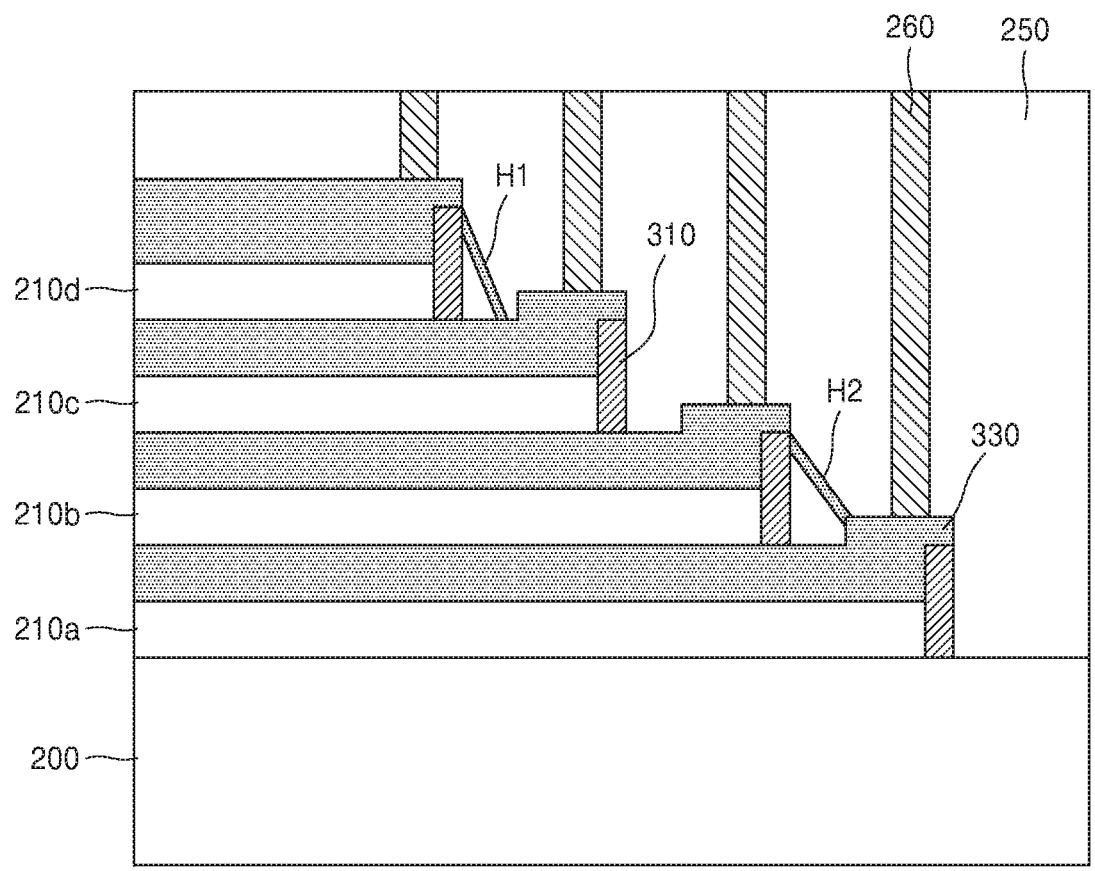

FIGS. 12 to 14 are cross-sectional diagrams for describing a substrate processing method according to other embodiments of the present disclosure. The substrate processing method according to the current embodiments may be a modified example of the substrate processing methods according to the previous embodiments. Repeated descriptions therebetween will not be provided herein.

Referring to FIG. 12, the interlayer insulating layer 250 is generated on the stair structure including the separation layers 310 and the pad layers 330, and then the via contacts 260 are generated by patterning the interlayer insulating layer 250. As described above, during the operation of generating the interlayer insulating layer 250, a raw material gas for generating the interlayer insulating layer 250 may be incompletely filled in a space between the sacrificial layer 220 and the separation layer 310 or a space between the pad layer 330 and the separation layer 310. In this case, a hole H1 connected to the sacrificial layer 220 or a hole H2 connected to the pad layer 330 may be generated.

Referring to FIG. 13, the sacrificial layers 220 and the pad layers 330 are removed. As such, the insulating layers 210, the interlayer insulating layer 250, and the via contacts 260 are exposed. Meanwhile, the hole H1 connected to the sacrificial layer 220 or the hole H2 connected to the pad layer 330 may expose a part of an adjacent sacrificial word line structure.

According to some embodiments of the present disclosure, before the interlayer insulating layer 250 is generated, the separation layers 310 for separating adjacent word line structures from each other are generated. Therefore, even though the hole H1 is generated during the operation of generating the interlayer insulating layer 250 and exposes a part of an adjacent word line structure, only the separation layer 310 is exposed.

Then, as shown in FIG. 14, conductive word line structures are generated by filling a conductive material in exposed spaces. In general word line structures, since the separation layers 310 are not present, when the hole H1 or H2 is generated during the operation of generating the interlayer insulating layer 250, adjacent conductive word line structures may be electrically connected to each other. However, according to some embodiments of the present disclosure, the risks of an electrical short circuit between adjacent conductive word line structures may be prevented or minimized by employing the separation layers 310.

The present disclosure relates to a substrate processing method and a device manufactured using the substrate processing method, and the device may be a semiconductor device, and more particularly, a vertical NAND (VNAND) flash memory device. The VNAND flash memory device includes a vertical gate stack. The gate stack is generated by alternately stacking SiO/SiN layers, and then generating a vertical channel penetrating through the gate stack. Then, SiN layers are etched from the SiO/SiN stack to generate word lines. That is, the SiN layers connected to contact plugs are replaced with conductive layers such as tungsten layers, and thus a gate stack having a stair structure is generated.

It is known that conductive layers such as tungsten layers contract in a subsequent operation such as a contact hole generating operation. One of reasons of contraction is crystallization of the conductive layers in a dry etching operation that creates heat. Contraction of the metal word lines may lead to cutoff of the word lines.

Figure 15:
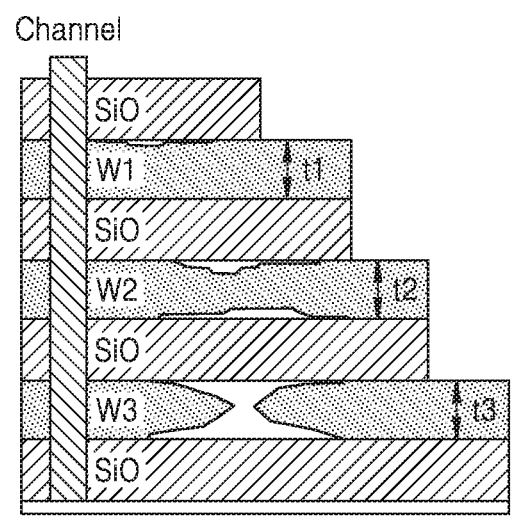
FIG. 15 is a cross-sectional diagram showing that cutoff of word lines during, for example, a dry etching operation when the word lines have the same thickness.

FIG. 15 is a cross-sectional diagram showing that cutoff of word lines during, for example, a dry etching operation for generating contact holes, when the word lines have the same thickness (i.e., t1=t2=t3). When heat energy generated by a heater is received from a lower surface of a substrate, crystallization due to heating become series in proportion to the height of a stack (because higher heat energy is required at a large height of the stack).

To minimize the risks of crystallization due to heating, tungsten may be overfilled in a tungsten filling process, and thus contraction of tungsten during the tungsten filling process may be complemented. However, the word lines may be connected to each other during the tungsten overfilling process and thus malfunction of a VNAND device may be caused.

In another aspect, since a lower tungsten layer receives more heat energy from the heater and thus is more crystallized, to prevent cutoff of the word lines, a thickness t3 of a bottom layer may be greater than a thickness t2 of a middle layer, and the thickness t2 of the middle layer may be greater than a thickness t1 of an upper layer. Therefore, crystallization may be prevented by proving a larger amount of tungsten to a lower layer in the word line generating operation (i.e., the tungsten overfilling process).

However, when the word lines are generated as described above, a resistance deviation occurs between the word lines, and the word lines are shorted because insulating layers (e.g., oxide layers) between the word lines have the same thickness. When the insulating layers are generated to have different thicknesses, device height and process complexity may increase.

One embodiment of the present disclosure employs a reverse topology selective (RTS) SiO layer as a barrier layer between metal word lines. Herein, "RTS" has a concept opposite to that of "topology selective (TS)" and means that a desired structure is generated by adjusting an energy application parameter of directional energy applied to a layer generated on a stair structure, to selectively densify/weaken the layer. For example, a "TS-SiO" layer refers to a SiO structure generated by densifying a layer on upper and lower surfaces of a stair structure (or by weakening the layer on a side surface of the stair structure) to remove the layer on the side surface of the stair structure and to leave the layer on the upper and lower surfaces of the stair structure. On the contrary, an "RTS-SiO" layer refers to a SiO structure generated by weakening a layer on upper and lower surfaces of a stair structure (or by densifying the layer on a side surface of the stair structure) to leave the layer on the side surface of the stair structure and to remove the layer on the upper and lower surfaces of the stair structure.

The RTS-SiO layer is generated between the tungsten word lines. The RTS-SiO layer generated on the stair structure of a SiO/SiN gate stack is selectively etched to remove the RTS-SiO layer on an upper surface of the stair structure and to leave the RTS-SiO layer on a side wall of the stair structure. The RTS-SiO layer is deposited using at least of PEALD, cyclic chemical vapor deposition (CVD), sequential plasma enhanced chemical vapor deposition (PECVD), and pulsed PECVD. Alternatively, the RTS-SiO layer may be a silicon oxycarbide (SiOC) layer.

The above-described RTS-SiO layer generating method according to the present disclosure may be summarized as described below. It is noted that the order of operations in the following description merely corresponds to an example and may be changed.

(a) Deposition of RTS-SiO layer: A gate stack is generated by alternately stacking SiO layers and SiN layers. Thereafter, a stair pattern is generated and a SiO layer (e.g., a RTS-SiO layer) is deposited on an upper surface and a side wall of the stair pattern. In an optional embodiment, the thickness of a lower SiN layer may be greater than the thickness of an upper SiN layer. That is, assuming that the thickness of an upper SiN layer is t1, the thickness of a middle SiN layer is t2, and the thickness of a lower SiN layer is t3, t1<t2<t3 may be satisfied.

(b) Etching of RTS-SiO layer: The RTS-SiO layer generated on an upper surface of the SiN layer is etched and removed. That is, an etching operation is performed in such a manner that the SiO layer (e.g., the RTS-SiO layer) generated on the upper surface of the stair pattern is removed and the SiO layer generated on the side wall of the stair pattern is rarely etched but remains. The SiO layer remaining on the side wall will be provided between word lines to prevent or minimize the risks of a short circuit between the word lines.

(c) Filling of word lines with metal: the SiN layers are replaced with metal. For example, a tungsten overfilling process may be used to compensate for contraction. Assuming that the thickness of an upper word line is t1, the thickness of a middle word line is t2, and the thickness of a lower word line is t3, t1<t2<t3 may be satisfied.

(d) Filling of contact holes: Tetraethoxy orthosilicate (TEOS) is filled on the stair pattern. Then, contact holes are generated, and via contacts are generated by filling the contact holes with metal.

The operations summarized in the above description will now be described in detail with reference to FIGS. 16 to 19. FIGS. 16 to 19 are cross-sectional diagrams for describing a substrate processing method according to other embodiments of the present disclosure. The substrate processing method according to the current embodiments may be a modified example of the substrate processing method according to the previous embodiments. Repeated descriptions therebetween will not be provided herein.

Figure 16:
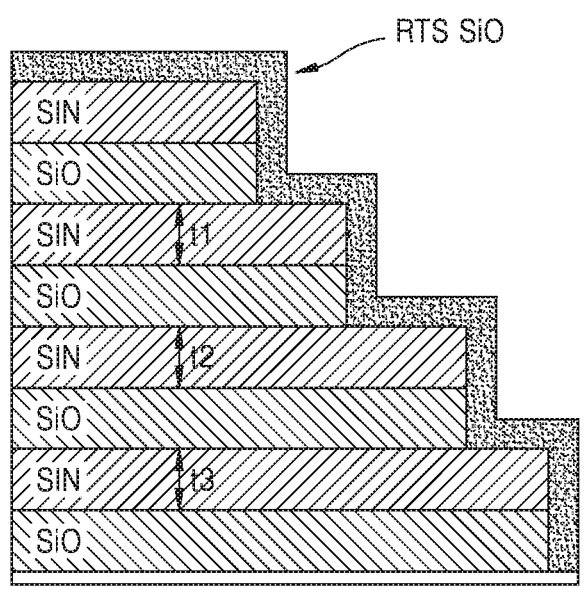
FIGS. 16, 17, 18 and 19 are cross-sectional diagrams for describing a substrate processing method according to other embodiments of the present disclosure.
Figure 17:
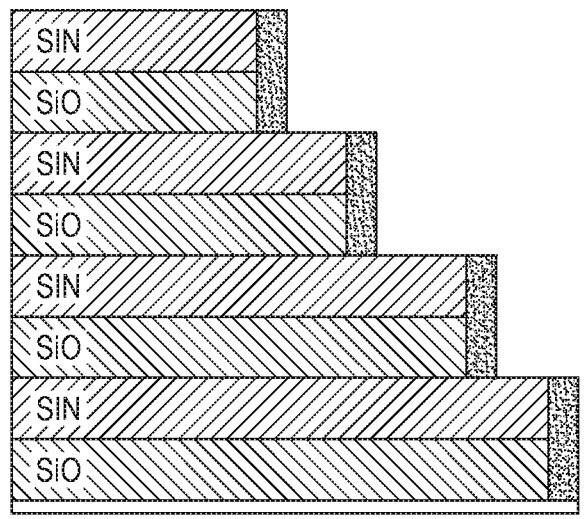
Figure 18:
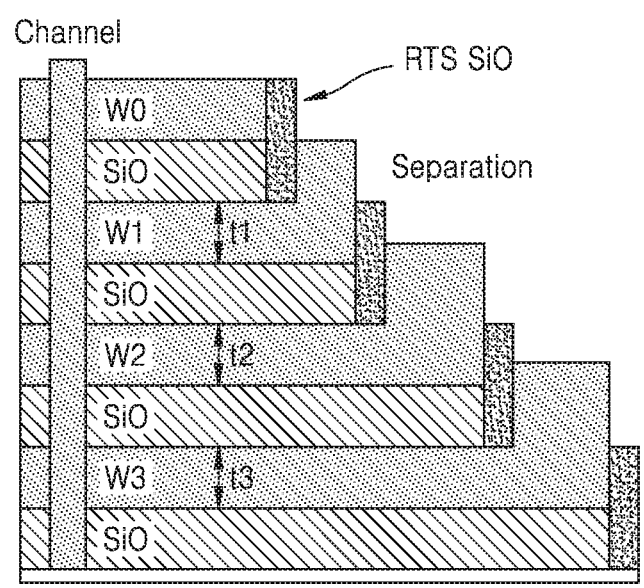
Figure 19:
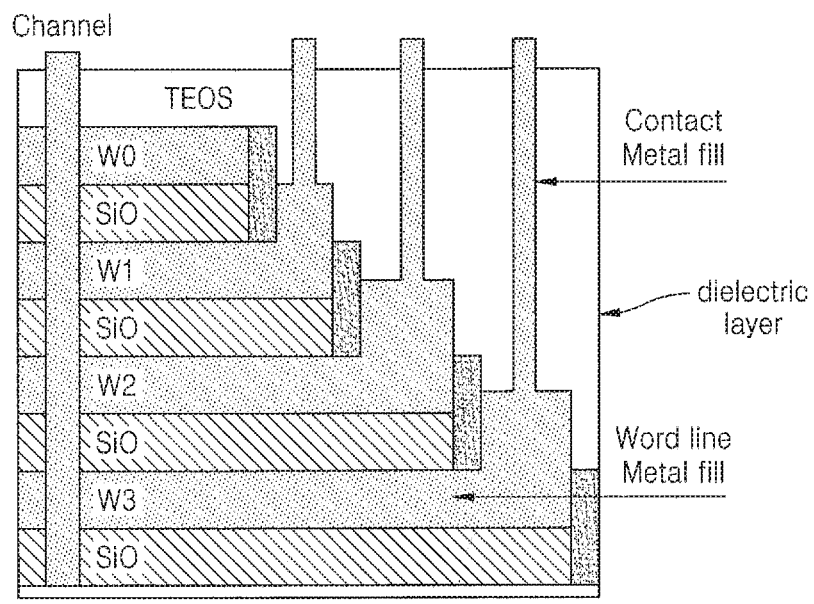

1) Operation 1 (see FIG. 16): Deposition of RTS-SiO layer. Initially, a SiO/SiN gate stack is generated in such a manner that the thickness of a lower SiN layer is greater than the thickness of an upper SiN layer. For example, the structure illustrated in FIG. 16 is generated. Herein, the thicknesses of the SiN layers may satisfy t1<t2<t3 to prevent cutoff due to crystallization of lower word lines among word lines generated to correspond to the SiN layers.

Then, a RTS-SiO layer is generated. Specifically, the RTS-SiO layer is deposited on a stair structure of the multilayer SiO/SiN gate stack in which ends of the SiN layers are exposed. The RTS-SiO layer may be deposited using at least one of PEALD, sequential PECVD, pursed CVD, and other equivalent methods. An oxygen-containing gas such as $O_2$, $O_3$, $N_2O$, or $NO_2$ may be used as a reactant of a SiO process. Optionally, a SiO-containing layer such as a SiOC layer may be deposited.

2) Operation 2 (see FIG. 17): Etching of RTS-SiO layer. The RTS-SiO layer generated on the exposed ends of the SiN layers is etched. In this operation, diluted hydrofluoric acid (DHF) of deionized water (DIW):hydrofluoric acid (HF)=100:1 is used as an etchant to etch the RTS-SiO$_2$ layer generated on an upper surface of the SiN layer, and the RTS-SiO$_2$ layer generated on a side surface of the stair structure (i.e., a side surface of the SiN layer) may be rarely etched or not etched.

3) Operation 3 (see FIG. 18): Filling of word lines with metal. The SiN layers of the gate stack are etched using an etchant such as phosphoric acid ($H_3PO_4$), and metal word lines are generated by filling etched spaces with tungsten. As described above, tungsten may be overfilled in the word lines to complement for contraction of tungsten. When a lower SiN layer has a larger thickness, the thickness of a lower tungsten layer may be greater than that of an upper tungsten layer. In this operation, the RTS-SiO layer remaining after operation 2 may prevent the tungsten word lines from being connected to each other. That is, the RTS-SiO layer serves as a barrier layer between the tungsten word lines, and then remains on the side wall of the stair structure.

4) Operation 4 (see FIG. 19): Filling of contact holes with metal. A dielectric layer is generated to cover a device structure. The dielectric layer may be made of SiO$_2$ using tetraethoxy orthosilicate (TEOS). A plurality of contact holes are generated and filled with metal such as tungsten to generate metal contacts, and the metal contacts are separately connected to the ends of the word lines filled with tungsten.

The mechanism of selective etching the RTS-SiO layer may be explained based on an ion bombardment effect. In general, ion bombardment in a plasma process is closely related to densification of a thin film. Therefore, a thin film generated on a surface perpendicular to a radical proceeding direction has strong chemical-resistance compared to a thin film generated on a surface parallel to the radical proceeding direction.

However, when plasma power or frequency exceeds a certain threshold, ion bombardment breaks a film bonding structure and weakens the chemical-resistance of the film. In this case, the thin film generated on the surface perpendicular to the radical proceeding direction has weak chemical-resistance compared to the thin film generated on the surface parallel to the radical proceeding direction. Therefore, the above-described operation of selectively etching a thin film according to the present disclosure may be performed by controlling a plasma condition (e.g., plasma power, plasma frequency, plasma on-time, or radical type).

Figure 20:
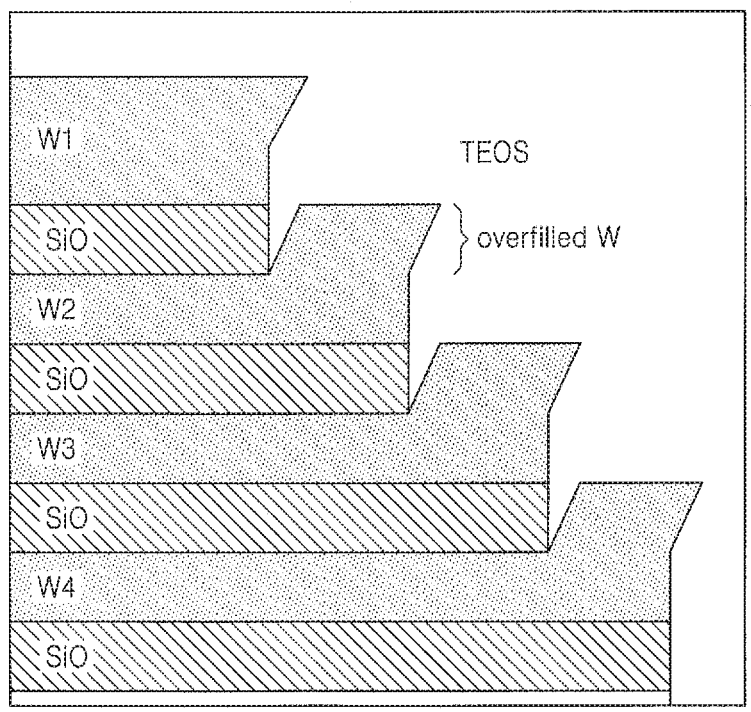
FIG. 20 is a cross-sectional diagram of a semiconductor device.

FIG. 20 is a cross-sectional diagram of a semiconductor device (not necessarily prior art), which is manufactured using processes similar to those of the above-described methods except that separation layers provided between word lines to prevent connection between the word lines are not generated, and that via contacts are generated after conductive word line structures are generated. Repeated descriptions therebetween will not be provided herein.

Referring to FIG. 20, the semiconductor device may be manufactured without generating separation layers in contact with side surfaces of SiN layers. That is, a SiO/SiN stack structure is generated and a vertical channel penetrating through the stack structure is generated. Then, the stack structure is etched to a stair structure and a SiN layer is deposited on the stair structure based on PEALD. After that, selective side etching is performed to remove the SiN layer deposited on a side surface of the stair structure and to leave the SiN layer deposited on an upper surface of the stair structure.

Subsequently, a TEOS layer is generated on the stair structure, and word lines are generated by removing the stacked SiN layers and the remaining SiN layer and then filling tungsten. Tungsten is filled in exposed portions of the stair structure as well as spaces from which the stacked SiN layers are removed. This word line structure may be referred to as an overfilled structure.

Thereafter, contact holes penetrating through the TEOS layer and connected to tungsten layers (i.e., overfilled tungsten layers) generated on the stair structure is generated, and metal layers are filled therein to connect the word lines to bit lines.

The overfilled tungsten layers may address a device instability issue due to dry etching selectivity. Specifically, to generate a metal-filled via to be connected to an upper bit line, a contact hole to be filled with metal using a dry etching process is generated. In the dry etching process, since an upper stair layer and a lower stair layer have different dry etching selectivity ratios (i.e., a time taken to generate a contact hole from an upper surface of the TEOS layer to an exposed upper surface of each stair layer differs), the contact hole penetrates an upper SiN layer to connect the upper SiN layer to a lower SiN layer. Thus, the tungsten layers may be connected to each other. The overfilled tungsten layers are referred to as pad layers in at least some embodiments of this disclosure to emphasize the function thereof without limiting a material.

Figure 21:
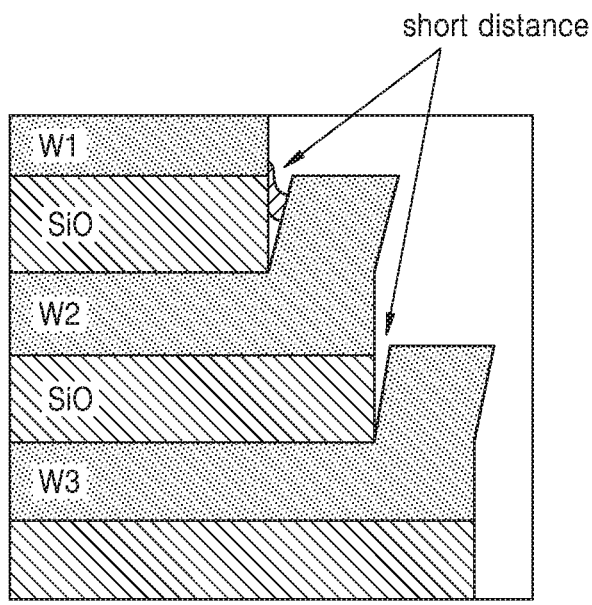
FIGS. 21 and 22 are cross-sectional diagrams showing that word lines are connected during a process.

However, when the distance between the overfilled tungsten layers is short as shown in FIG. 21, a raw material gas of TEOS may be incompletely filled in a gap therebetween. Due to such incomplete filling, the tungsten layers may be subsequently connected to each other without being separated from each other. That is, a raw material gas (e.g., tungsten hexafluoride (WF$_6$)) of the tungsten layers may penetrate into a narrow space where the TEOS layer is not sufficiently generated, and thus the tungsten layers may be connected to each other as shown in FIG. 21.

Figure 22:
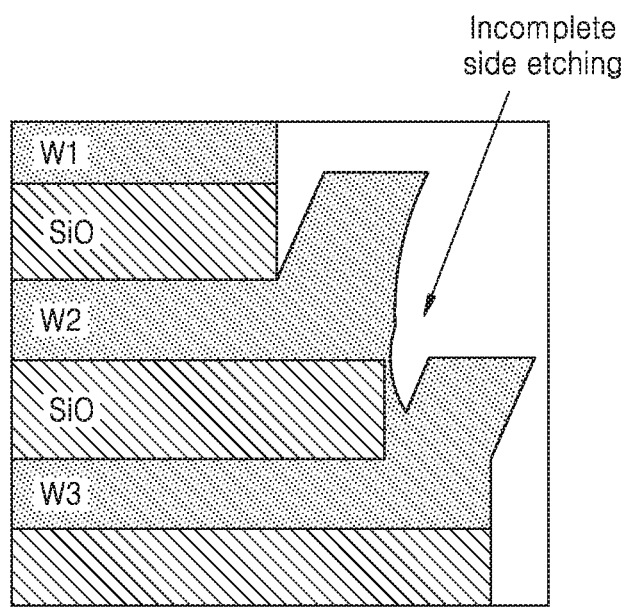
Figure 23:
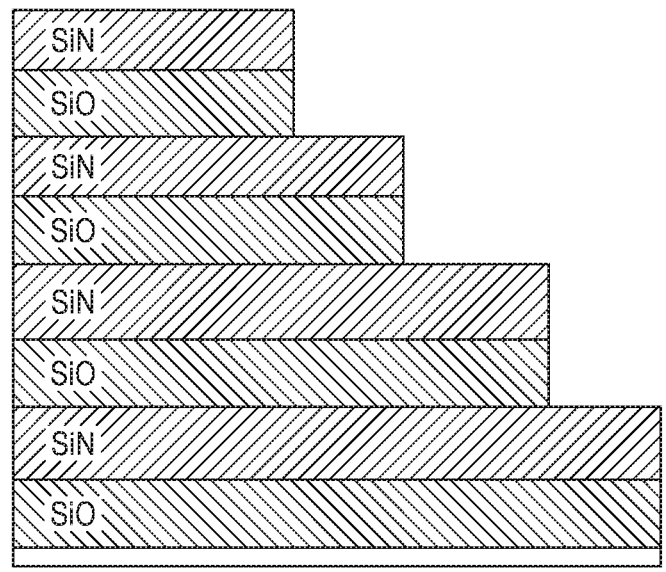
FIGS. 23, 24, 25, 26, 27, 28, 29 and 30 are cross-sectional diagrams for describing a substrate processing method according to other embodiments of the present disclosure.
Figure 24:
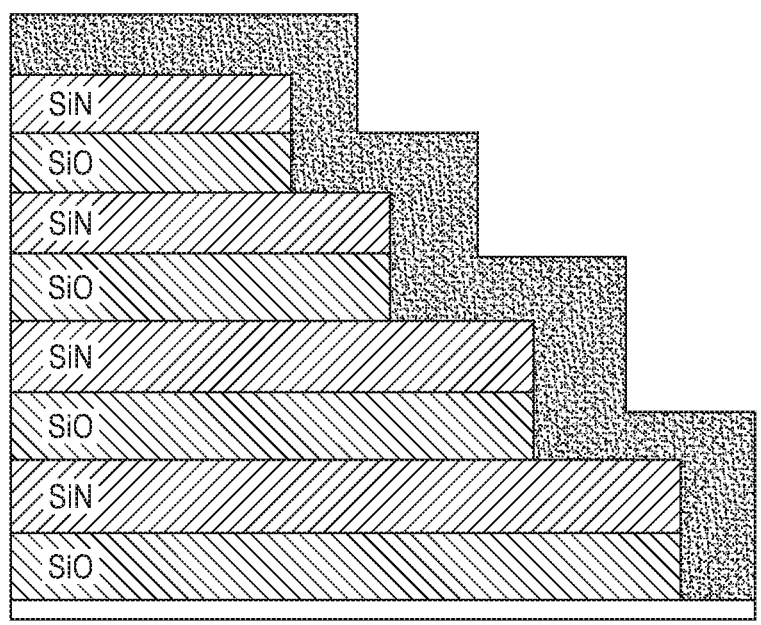
Figure 25:
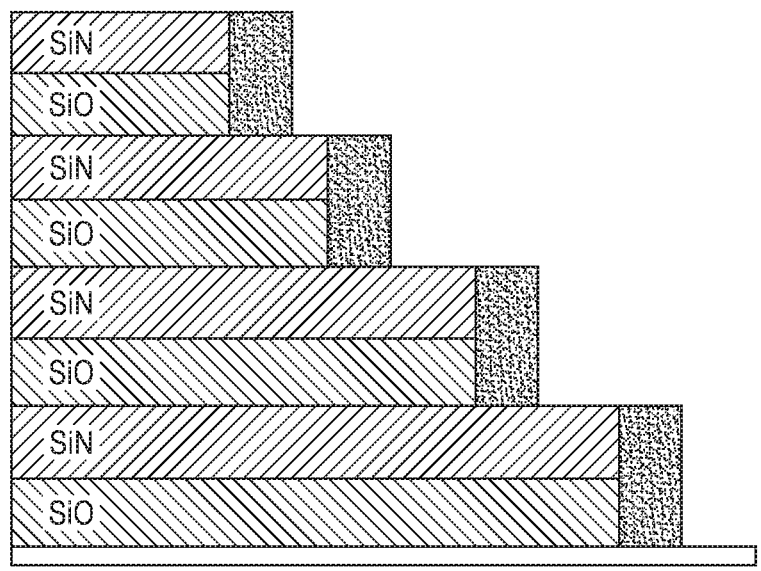
Figure 26:
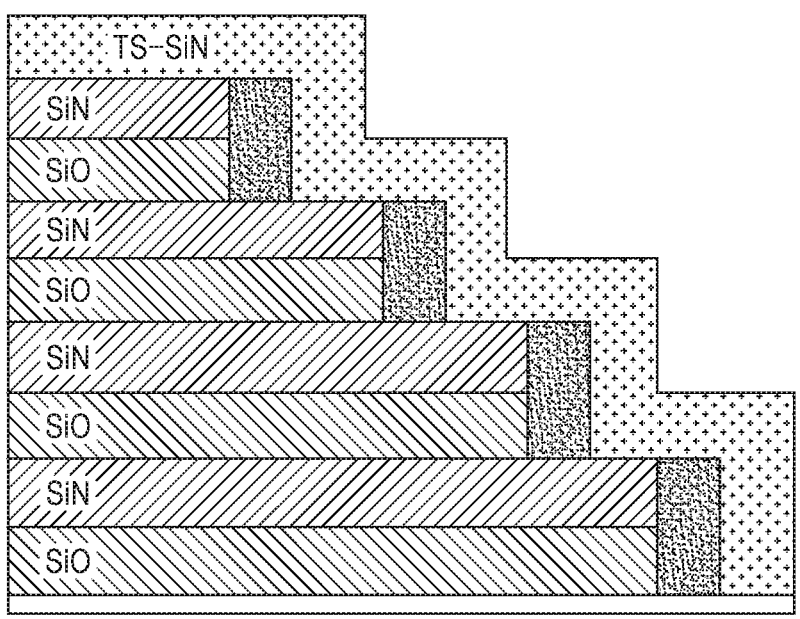
Figure 27:
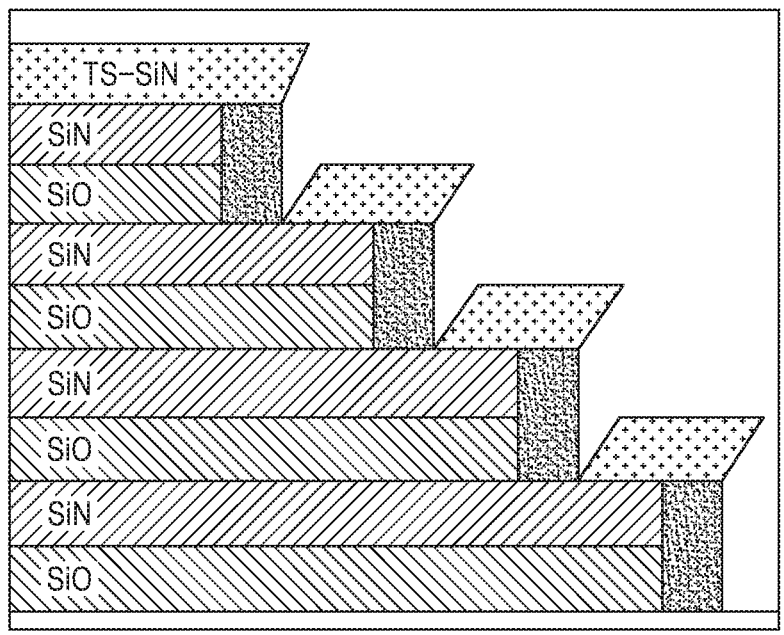
Figure 28:
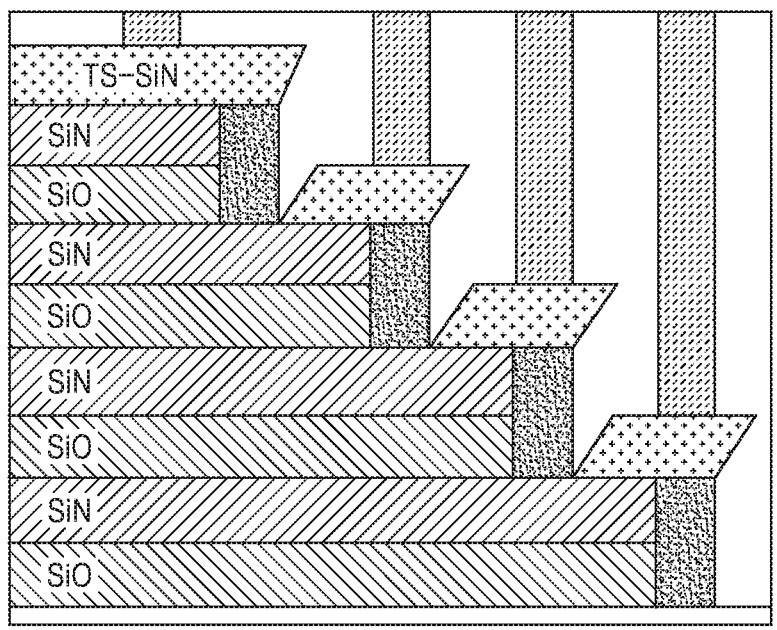
Figure 29:
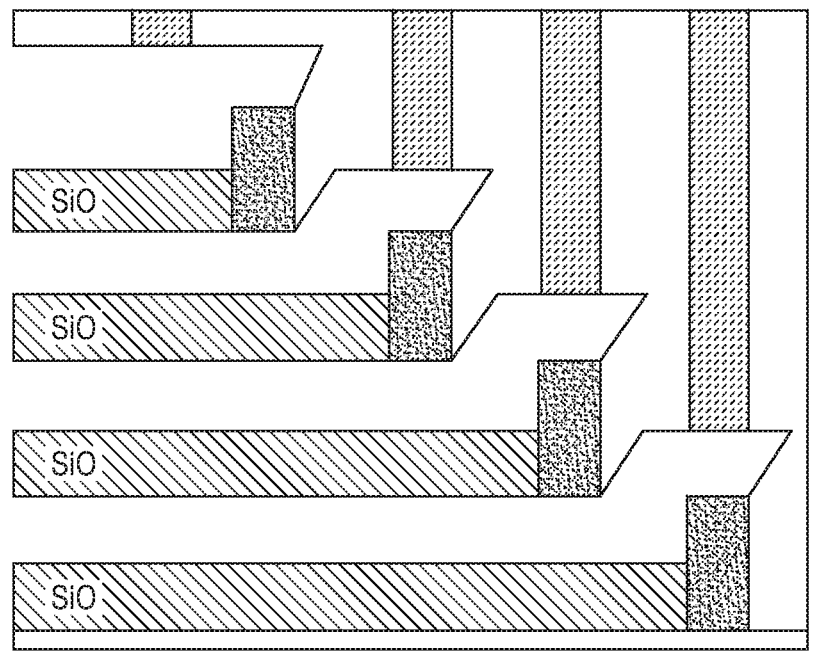

In addition, as shown in FIG. 22, when a TS-SiN layer is selectively etched before the TEOS layer is generated, the TS-SiN layer generated on a side surface of the stair structure may not be completely removed and thus the tungsten layers may be connected to each other in a subsequent process. In this case, electrical characteristics of the device may deteriorate and thus the device may malfunction.

At least some embodiments of the present disclosure can provide certain benefits. For example, device stability may be achieved by generating separation layers to prevent contact between an upper tungsten layer (i.e., an upper word line) and a lower tungsten layer (i.e., a lower word line). In addition, high-quality separation layers may be generated using a simple process by depositing and selectively etching a RTS-SiO layer based on PEALD.

FIGS. 23 to 30 are cross-sectional diagrams for describing a substrate processing method according to other embodiments of the present disclosure. The substrate processing method according to the current embodiments may be a modified example of the substrate processing methods according to the previous embodiments. Repeated descriptions therebetween will not be provided herein.

According to the present disclosure, a $SiO_2$ layer is deposited on a SiO/SiN gate stack having a stair shape based on PEALD, and then selective stair top etching is performed to leave the $SiO_2$ layer on a side surface of the stair structure and to remove the $SiO_2$ layer on an upper surface of the stair structure. Such selective etching may be achieved by adjusting a plasma application parameter or using a lithography process without a weakening/densification process.

Then, a SiN layer is deposited on the stair structure based on PEALD. Thereafter, selective stair side etching is performed to leave the SiN layer on an upper surface of the stair structure and to remove the SiN layer on a side surface of the stair structure (a protective layer is generated). Subsequently, a thick insulating layer (e.g., a TEOS layer) serving as an interlayer insulating layer is deposited on the gate stack and the SiN layer is removed. After the SiN layer is removed, removed space is filled with a conductive material to generate a word line. In addition, via contact holes through the TEOS layer exposing the word line is generated. Then, the via contact holes are filled with a conductive material, e.g., metal, to connect word lines to bit lines.

The above-described substrate processing method may be summarized as described below. It is noted that the order of operations in the following description merely corresponds to an example and may be changed.

Operation 1 (see FIG. 23): In this operation, a SiO/SiN gate stack layer is generated and then is etched to form a stair structure. The SiO/SiN stack layer may be generated by alternately stacking SiO/SiN layers based on CVD, PECVD, ALD or PEALD.

Operation 2 (see FIG. 24): In this operation, a SiO layer is deposited on the SiO/SiN gate stack layer based on PEALD. In this operation, deposition is performed by maintaining a high plasma density condition. For example, high plasma power may be applied. Therefore, selective etching may be performed on the stair structure in a subsequent operation (operation 3, see FIG. 25).

Operation 3 (see FIG. 25): In this operation, the SiO layer deposited in operation 2 is selectively etched. For selective etching, wet etching is performed using $H_3PO_4$ to etch the SiO layer deposited on an upper surface of the stair structure and to leave the SiO layer deposited on a side surface of the stair structure. Since a high plasma density condition is maintained in the deposition process of operation 2, breakage of a thin film due to ions is more significant than densification of the thin film due to an ion bombardment effect and thus the SiO layer of the upper surface of the stair structure is etched faster than the SiO layer of the side surface of the stair structure. The SiO layer generated on the side surface of the stair structure in this operation is referred to as a "RTS-SiO layer" as opposed to a "TS-SiN" layer of operations 4 and 5.

Operation 4 (see FIG. 26): In this operation, a SiN layer is deposited on the selectively etched SiO layer (i.e., on the SiO layer remaining on the side surface of the stair pattern) based on PEALD. In this operation, deposition is performed by maintaining a low plasma density condition. For example, low plasma power may be applied. Therefore, the SiN layer may be selectively etched on the stair structure in a subsequent operation (operation 5).

Operation 5 (see FIG. 27): In this operation, the SiN layer deposited in the previous operation is selectively etched. In this operation, for selective etching, wet etching is performed using diluted hydrofluoric acid (DHF) of hydrofluoric acid (HF):deionized water (DIW)=1:100 to etch the SiN layer deposited on the side surface of the stair structure and to leave the SiN layer deposited on the upper surface of the stair structure (i.e., the SiN layer generated on the SiN layer serving as the sacrificial layers 220). The SiN layer remaining on the stair structure serves as a protective layer for preventing via contact holes to be generated in a subsequent operation, from penetrating through the SiN layer of the gate stack in the stair structure. In addition, the remaining SiN layer serves as contact pads for connecting via contact holes to word lines (i.e., the gate stack SiN layer to be replaced with metal). In the deposition process of operation 4, since a low plasma density condition is maintained, densification of a thin film due to an ion bombardment effect is more significant than breakage of the thin film due to ions. Therefore, the SiN layer of the side surface of the stair structure is etched faster than the SiN layer of the upper surface of the stair structure. The SiN layer generated on the upper surface of the stair structure in this operation is referred to as a "TS-SiN" layer. After the TS-SiN layer is generated using selective etching, an insulating material layer is deposited on the stair structure. The insulating material layer may be a TEOS layer and may serve as a mold layer in a subsequent operation for generating via contact holes.

Operation 6 (see FIG. 28): Via contact holes connected to the TS-SiN layer through the TEOS layer generated in operation 5 are generated. The via contact holes are generated using dry etching. After the via contact holes are generated, via contacts are generated by filling the via contact holes with a conductive material, e.g., aluminum, tungsten, or an equivalent conductive material.

Operation 7 (see FIG. 29): In this operation, the SiN layer of the gate stack and the TS-SiN layer generated in operation 5 are removed based on wet etching. Wet etching may be performed using $H_3PO_4$.

Operation 8 (see FIG. 30): In this operation, a conductive material is filled in spaces from which the SiN layer is removed in operation 7. In this embodiment, tungsten is filled using CVD.

Figure 30:
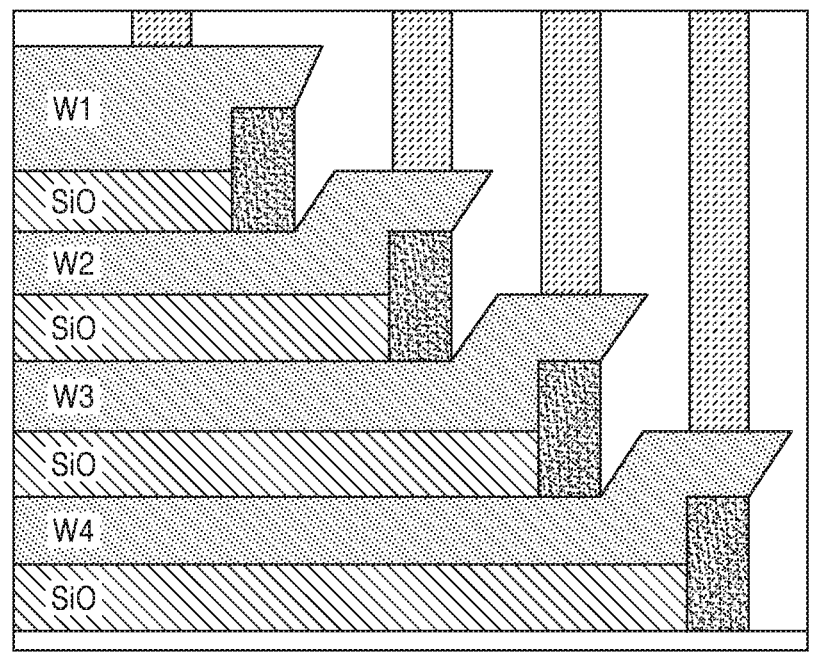

FIG. 30 shows word lines generated by replacing the SiN layer serving as the sacrificial layers 220 and the SiN layer serving as the pad layers, with metal, and the RTS-$SiO_2$ layer located between the word lines. As shown in FIG. 30, the metal word lines may be completely separated from each other by the RTS-$SiO_2$ layer, and thus contact between the metal word lines may be prevented.

Shapes of elements in the drawings merely correspond to examples for clear understanding of the present disclosure. It is noted that the illustrated shapes may be variously changed. In the drawings, like reference numerals denote like elements.

While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing method comprising:
stacking a plurality of stack structures each comprising an insulating layer and a sacrificial layer formed over the insulating layer;
generating a stair structure by partially removing the stack structures, the stair structure comprising a plurality of side surfaces;
generating a separation layer on each of the plurality of side surfaces of the stair structure; and
replacing the sacrificial layer of each stack structure with one of a plurality of conductive word line structures,
wherein the separation layer is provided between adjacent ones of the conductive word line structures,
wherein the conductive word line structure comprises a first conductive layer extending toward a channel and a second conductive layer on the first conductive layer, and
wherein at least a part of a side surface of the first conductive layer is in contact with the separation layer.

2. A substrate processing method comprising:
stacking a plurality of stack structures each comprising an insulating layer and a sacrificial layer formed over the insulating layer;
generating a stair structure by partially removing the stack structures, the stair structure comprising a plurality of side surfaces;
generating a separation layer on each of the plurality of side surfaces of the stair structure;
replacing the sacrificial layer of each stack structure with one of a plurality of conductive word line structures, wherein the separation layer is provided between adjacent ones of the conductive word line structures;
generating a pad layer on the sacrificial layer; and
generating an interlayer insulating layer on the stair structure,
wherein replacing the sacrificial layer comprises:
removing the sacrificial layer and the pad layer; and
filling a conductive material in a space from which the sacrificial layer and the pad layer are removed.

3. The substrate processing method of claim 2, wherein a short circuit between the adjacent ones of the conductive word line structures is prevented by the separation layer during the filling of the conductive material.

4. The substrate processing method of claim 2, wherein at least one hole connected to the sacrificial layer is generated during the generating of the interlayer insulating layer, and
wherein a conductive protrusion filling the hole is generated during the replacing.

5. The substrate processing method of claim 1,
wherein the adjacent ones of the conductive word line structures comprise a first stack structure and a second stack structure formed over the first stack structure, and
wherein the first conductive layer of the first stack structure and the second conductive layer of the second stack structure are spaced apart from each other by a height of the separation layer in a vertical direction.

6. The substrate processing method of claim 1, wherein the second conductive layer comprises a first protrusion protruding from the first conductive layer, and
wherein the first protrusion is in contact with the separation layer.

7. The substrate processing method of claim 6, wherein the separation layer has a spacer shape, and
wherein a lower surface of the second conductive layer has a profile corresponding to the spacer shape.

8. The substrate processing method of claim 6, wherein the second conductive layer further comprises a second protrusion protruding from an end of the first protrusion in a downward direction.

9. The substrate processing method of claim 6, wherein the second conductive layer comprises:
a first region overlapped with the first conductive layer; and
a second region overlapped with the separation layer.

10. The substrate processing method of claim 9, wherein a via contact in contact with the conductive word line structure is generated, and
wherein the via contact is in contact with the first and second regions of the second conductive layer.

11. The substrate processing method of claim 1, wherein the generating of the separation layer comprises:
generating a first layer on the stair structure, the first layer comprising a first portion disposed on each of the plurality of side surfaces of the stair structure and a second portion disposed on each of a plurality of upper surfaces of the stair structure;
selectively densifying the first layer by applying a first energy in such a manner that the first portion is more densified than the second portion; and
isotropically etching the first layer to remove the second portion of the first layer to leave the first portion of the first layer.

12. The substrate processing method of claim 2, wherein the generating of the pad layer comprises:
generating a second layer on the stair structure, the second layer comprising a first portion disposed on each of the plurality of side surfaces of the stair structure and a second portion disposed on each of a plurality of upper surfaces of the stair structure;
selectively densifying the second layer by applying a second energy in such a manner that the second portion of the second layer is more densified than the first portion of the second layer; and
isotropically etching the second layer to remove the first portion of the second layer to leave the second portion of the second layer.

13. The substrate processing method of claim 11, wherein the first energy is equal to or higher than a preset threshold, and weakens the second portion of the first layer.

14. A semiconductor device comprising:
a substrate;
at least one memory cell string protruding and extending in an upward direction from the substrate;
a first word line formed over the substrate and connected to a first memory cell of the memory cell string;
a second word line formed over the first word line and connected to a second memory cell of the memory cell string;
an insulating layer interposed between the first word line and the second word line, the insulating layer comprising a plurality of side surfaces; and
a separation layer disposed on each of the plurality of the side surfaces of the insulating layer,
wherein each of the first and second word lines comprises:
a first conductive layer extending toward a channel; and
a second conductive layer provided on the first conductive layer,
wherein at least a part of a side surface of the first conductive layer of the second word line is in contact with the separation layer, and wherein the second conductive layer comprises a first protrusion protruding from the first conductive layer in a horizontal direction.

15. The semiconductor device of claim 14, wherein the second conductive layer further comprises a second protrusion protruding from an end of the first protrusion in a downward direction.

\* \* \* \* \*